(12) United States Patent
Kim et al.

(10) Patent No.: US 11,581,347 B2
(45) Date of Patent: Feb. 14, 2023

(54) IMAGE SENSOR

(71) Applicant: SAMSUNG ELECTRONICS CO., LTD., Suwon-si (KR)

(72) Inventors: Hongki Kim, Hwaseong-si (KR);
Donghyun Kim, Hwaseong-si (KR);
Minkwan Kim, Hwaseong-si (KR);
Minkyung Kim, Yongin-si (KR);
Minho Jang, Suwon-si (KR); In Sung Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 16/775,937

(22) Filed: Jan. 29, 2020

(65) Prior Publication Data

US 2020/0403025 A1    Dec. 24, 2020

(30) Foreign Application Priority Data

Jun. 21, 2019  (KR) .................. 10-2019-0074388

(51) Int. Cl.
*H01L 27/146* (2006.01)

(52) U.S. Cl.
CPC .. *H01L 27/14621* (2013.01); *H01L 27/14603* (2013.01); *H01L 27/14627* (2013.01); *H01L 27/14685* (2013.01); *G09G 2300/0443* (2013.01); *H01L 27/14623* (2013.01)

(58) Field of Classification Search
CPC ....... H01L 27/14621; H01L 31/02162–02165; H01L 27/14627; H01L 27/14603–14607; H01L 27/1463; H01L 27/14623; G09G 2300/0443
See application file for complete search history.

(56) References Cited

U.S. PATENT DOCUMENTS

| 7,341,885 | B2 | 3/2008 | Kim |
| 7,667,796 | B2 | 2/2010 | Hasei et al. |
| 8,669,134 | B2 | 3/2014 | Ito et al. |
| 9,941,318 | B2 | 4/2018 | Hirano et al. |
| 2008/0164551 | A1 | 7/2008 | Yun |
| 2010/0253819 | A1* | 10/2010 | Yokozawa ........ H01L 27/14621 348/E5.091 |

(Continued)

FOREIGN PATENT DOCUMENTS

| JP | 2007-88057 A | 4/2007 |
| KR | 10-0399065 B1 | 9/2003 |

(Continued)

*Primary Examiner* — Scott B Geyer
(74) *Attorney, Agent, or Firm* — Sughrue Mion, PLLC

(57) ABSTRACT

An image sensor and a method of manufacturing thereof are provided. The image sensor includes a substrate, a grid structure, and color filters. The substrate includes a pixel separation structure defining pixel regions, and a sub-pixel regions for each pixel region. The grid structure is disposed on the substrate and includes first fence segments provided between the sub-pixel regions, and second fence segments provided between neighboring pixel regions. The grid structure defines openings corresponding respectively to the sub-pixel regions. The color filters are disposed in the openings defined by the grid structure. Each of the color filters has a flat top surface and the flat top surface of each color filter is parallel to a bottom surface thereof.

17 Claims, 33 Drawing Sheets

(56) References Cited

U.S. PATENT DOCUMENTS

| | | | | |
|---|---|---|---|---|
| 2015/0318320 | A1* | 11/2015 | Lin | H01L 27/14603 |
| | | | | 257/432 |
| 2016/0172412 | A1* | 6/2016 | Lee | H01L 27/14605 |
| | | | | 257/432 |
| 2017/0084652 | A1* | 3/2017 | Chang | H01L 27/14627 |
| 2018/0114805 | A1 | 4/2018 | Takiguchi et al. | |
| 2018/0190700 | A1 | 7/2018 | Hirano et al. | |
| 2018/0286895 | A1* | 10/2018 | Watanabe | H01L 27/14612 |
| 2018/0292578 | A1 | 10/2018 | Kageyama et al. | |
| 2019/0132506 | A1* | 5/2019 | Cheng | H01L 27/1463 |
| 2019/0157329 | A1* | 5/2019 | Kim | H01L 27/14621 |
| 2019/0281226 | A1* | 9/2019 | Wang | H04N 5/232122 |
| 2020/0219920 | A1* | 7/2020 | Hur | H01L 27/14685 |
| 2020/0219925 | A1* | 7/2020 | Jang | H04N 5/37457 |
| 2021/0193727 | A1* | 6/2021 | Asatsuma | H01L 27/14621 |

FOREIGN PATENT DOCUMENTS

| | | |
|---|---|---|
| KR | 10-0602368 B1 | 7/2006 |
| KR | 10-0658921 B1 | 12/2006 |
| KR | 10-0734688 B1 | 7/2007 |

* cited by examiner

FIG. 2B
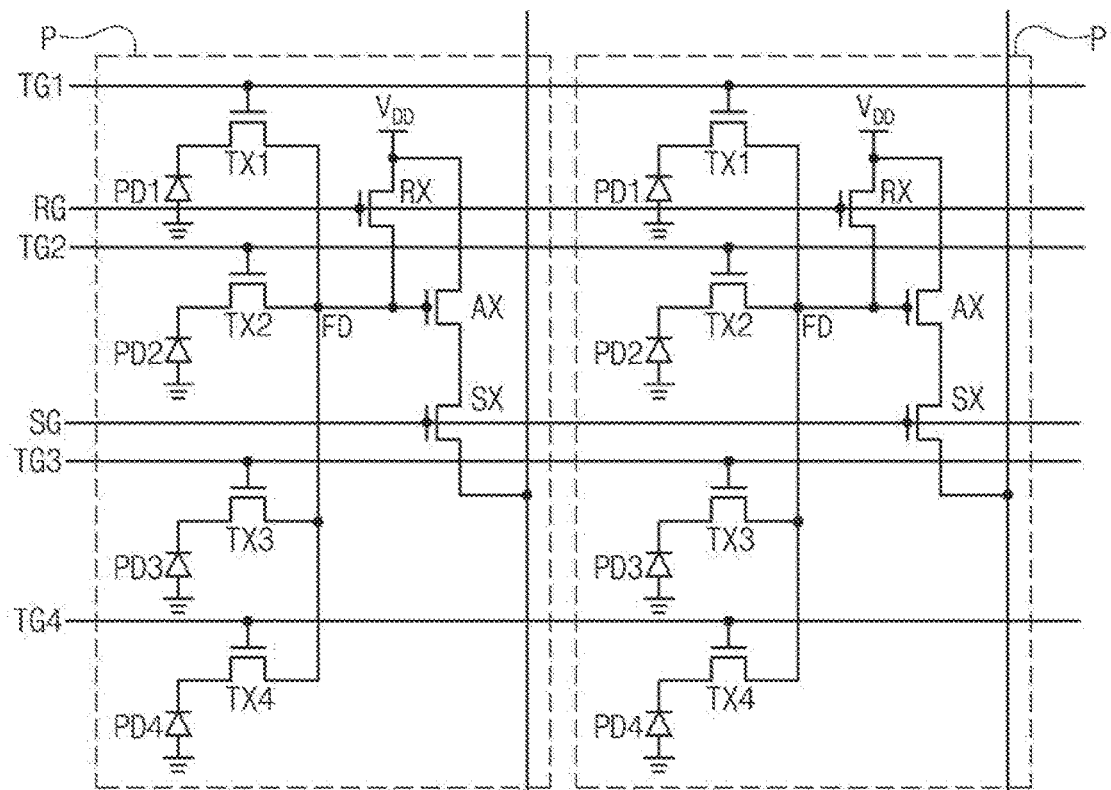
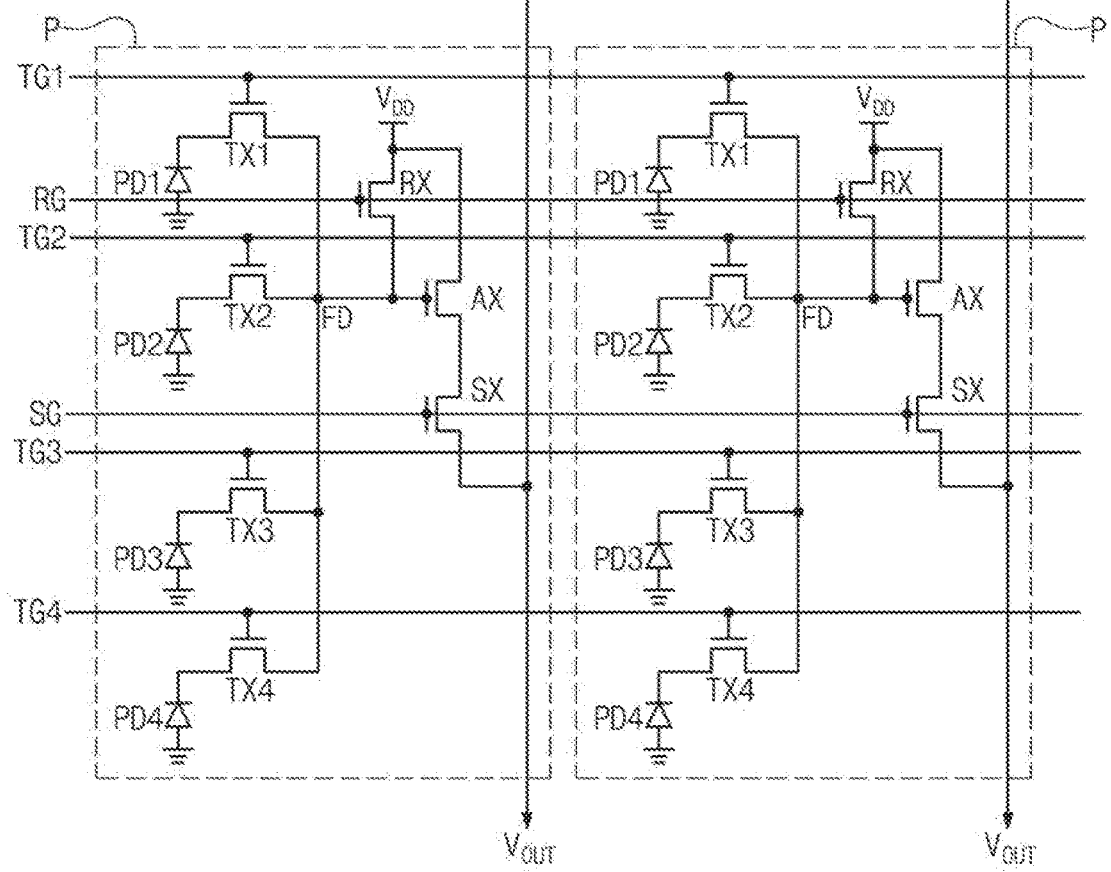

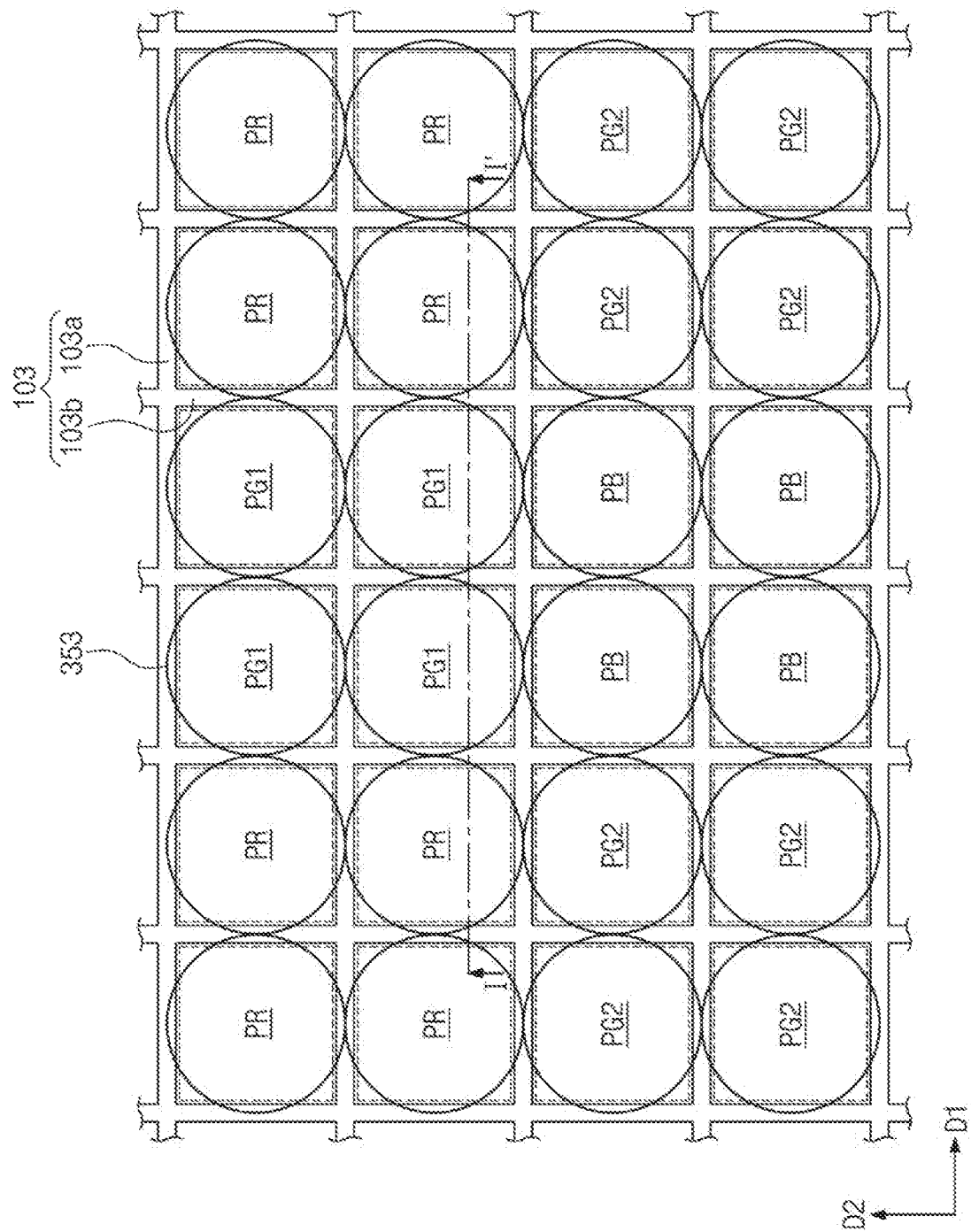

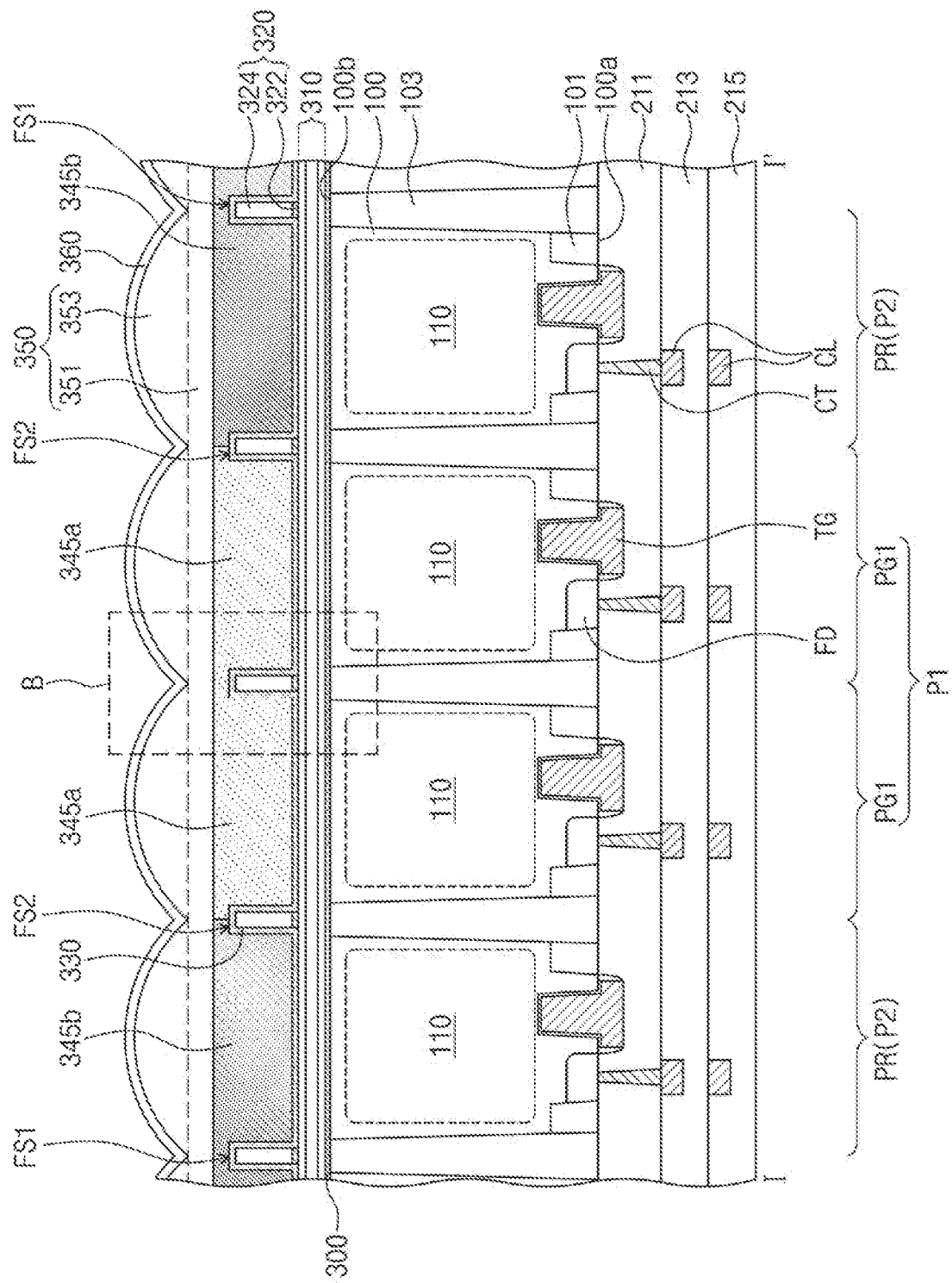

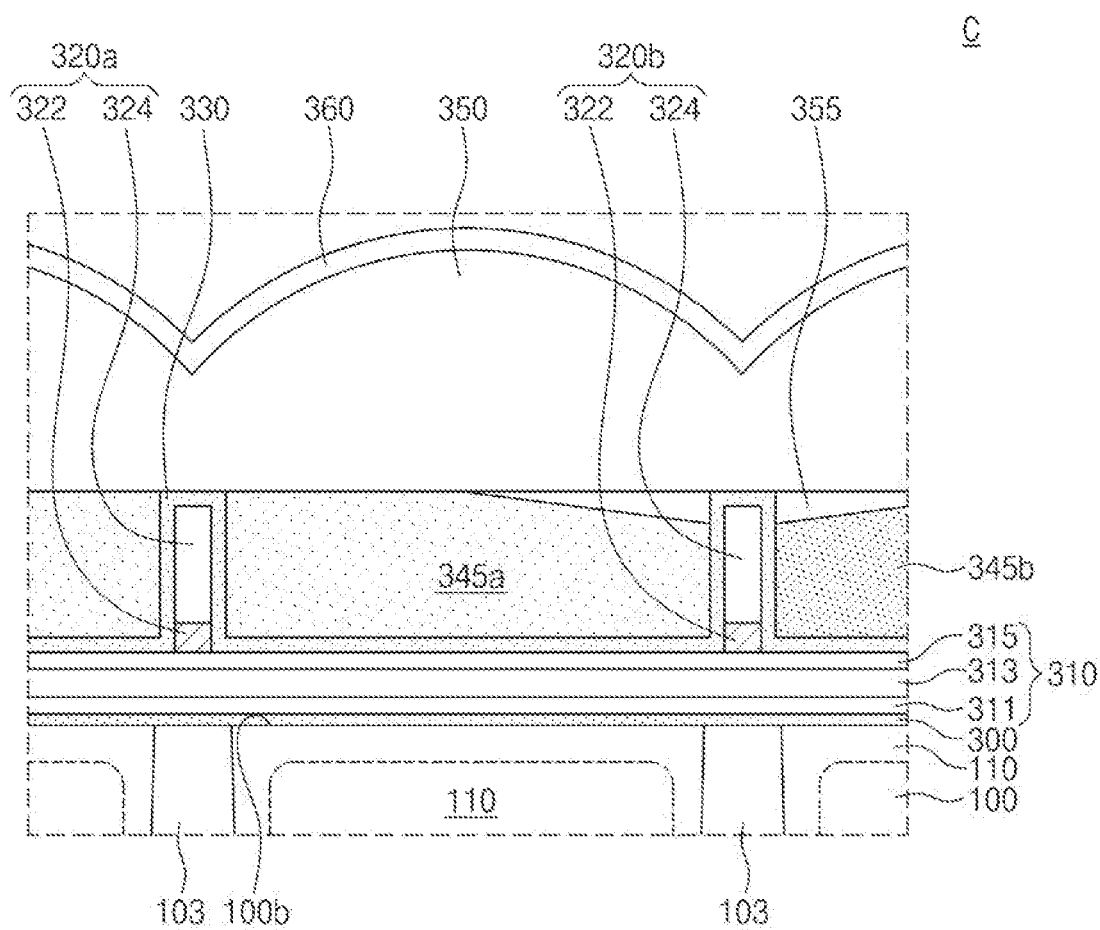

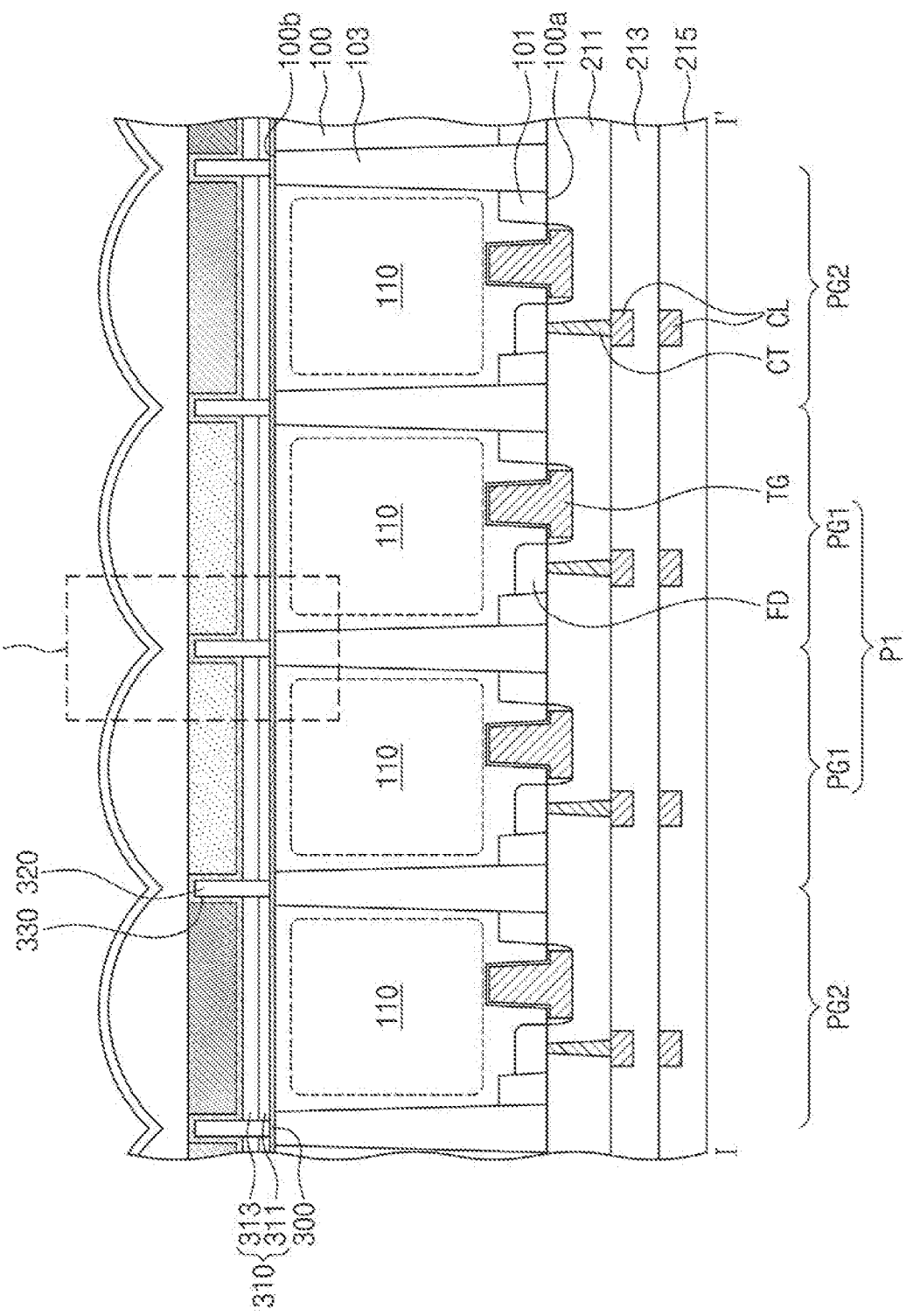

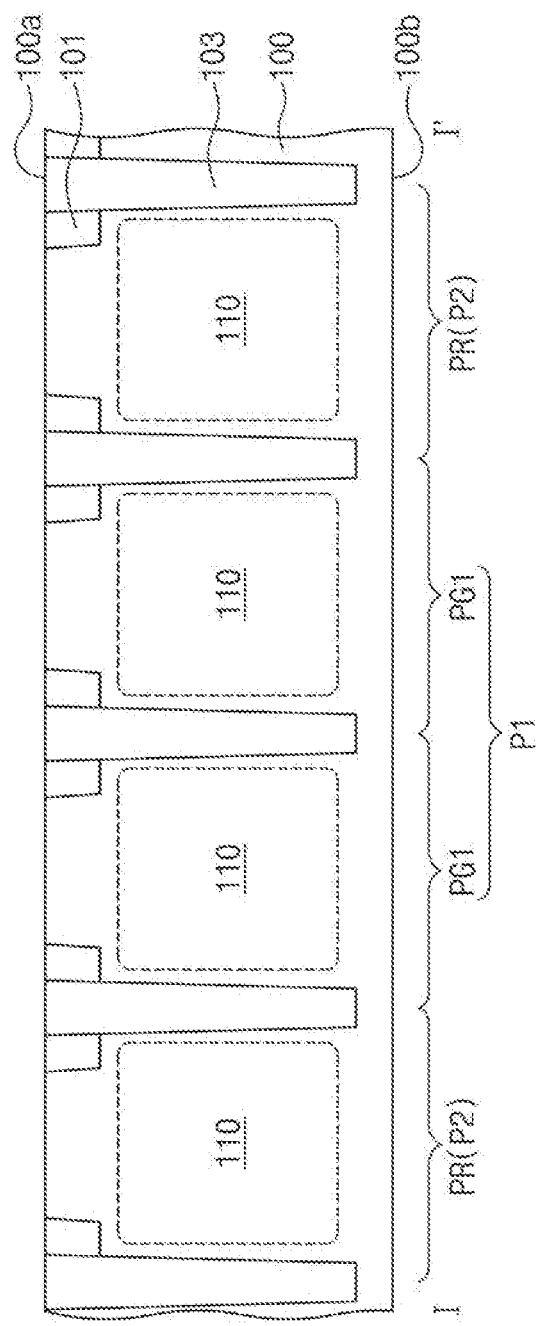

IMAGE SENSOR

CROSS-REFERENCE TO RELATED APPLICATION

This U.S. nonprovisional application claims priority under 35 U.S.C. § 119 to Korean Patent Application No. 10-2019-0074388 filed on Jun. 21, 2019 in the Korean Intellectual Property Office, the entire contents of which are hereby incorporated by reference.

BACKGROUND

1. Field

The present disclosure relates to an image sensor and a method of fabricating the same, and more particularly, to an image sensor with increased electrical and optical characteristics and a method of fabricating the same.

2. Description of Related Art

An image sensor converts photonic images into electrical signals. Recent advances in computer and communication industries have led to strong demands in high performances image sensors in various consumer electronic devices such as digital cameras, mobile phones, camcorders, Personal Communication Systems (PCSs), game consoles, security cameras, and medical micro-cameras.

SUMMARY

It is an aspect to provide an image sensor with increased electrical and optical characteristics.

Aspects are not limited to the mentioned above, and other aspects which have not been mentioned above will be clearly understood to those skilled in the art from the following description.

According to an aspect of some example embodiments, there is provided an image sensor including a substrate including a pixel separation structure defining a plurality of pixel regions, and a plurality of sub-pixel regions for each pixel region of the plurality of pixel regions; a grid structure disposed on the substrate and including first fence segments provided between the sub-pixel regions, and second fence segments provided between neighboring pixel regions, the grid structure defining a plurality of openings corresponding respectively to the plurality of sub-pixel regions; and a plurality of color filters disposed in the openings defined by the grid structure, each of the color filters having a flat top surface, the flat top surface of each color filter being parallel to a bottom surface thereof.

According to another aspect of some example embodiments, there is provided an image sensor including a substrate having a first surface and a second surface opposing the first surface, the substrate including a pixel separation structure defining a plurality of pixel regions; a device isolation layer disposed adjacent to the first surface of the substrate on each of the plurality of pixel regions, the device isolation layer defining active regions in the plurality of pixel regions; a plurality of interlayer dielectric layers stacked on the first surface of the substrate and including contact plugs and connection lines; a fixed charge layer disposed on the second surface of the substrate; a planar dielectric layer disposed on the fixed charge layer; a grid structure disposed on the planar dielectric layer to overlap the pixel separation structure in plan view, the grid structure including fence segments provided between neighboring pixel regions, the grid structure defining a plurality of openings corresponding respectively to the plurality of pixel regions; a plurality of color filters disposed in the openings defined by the grid structure; a sacrificial planar layer between adjacent ones of the color filters, the sacrificial planar layer having a top surface coplanar with uppermost surfaces of each of the color filters; and a micro-lens array disposed on the plurality of color filters.

According to another aspect of some example embodiments, there is provided a method of manufacturing an image sensor, the method comprising providing a substrate having a plurality of pixel regions, and a plurality of sub-pixel regions for each pixel region; forming a grid structure on the substrate, the grid structure including first fence segments provided between the sub-pixel regions, and second fence segments provided between neighboring pixel regions; forming preliminary color filters on the pixel regions, the preliminary color filters filling spaces defined by the grid structure, wherein in each pixel region, a corresponding preliminary color filter covers the first fence segment of the grid structure in the pixel region; forming a sacrificial planar layer to cover top surfaces of the preliminary color filters; and performing a planarization process on the sacrificial planar layer to form color filters on the pixel regions that have a planar top surface parallel to a bottom surface thereof after the planarization process.

BRIEF DESCRIPTION OF THE DRAWINGS

FIGS. 2A and 2B illustrate circuit diagrams showing an active pixel sensor array of an image sensor according to some example embodiments;

FIG. 4A illustrates a plan view showing an image sensor according to some example embodiments;

FIG. 6 illustrates a cross-sectional view taken along line I-I' of FIG. 4A, showing an image sensor according to some example embodiments;

FIGS. 9A and 9B illustrate enlarged views showing section C of FIG. 8.

FIG. 10A illustrates a cross-sectional view taken along line I-I' of FIG. 4A, showing an image sensor according to some example embodiments;

DETAILED DESCRIPTION

An image sensor and a method of fabricating the same according to some example embodiments will be discussed in conjunction with the accompanying drawings.

Figure 1:
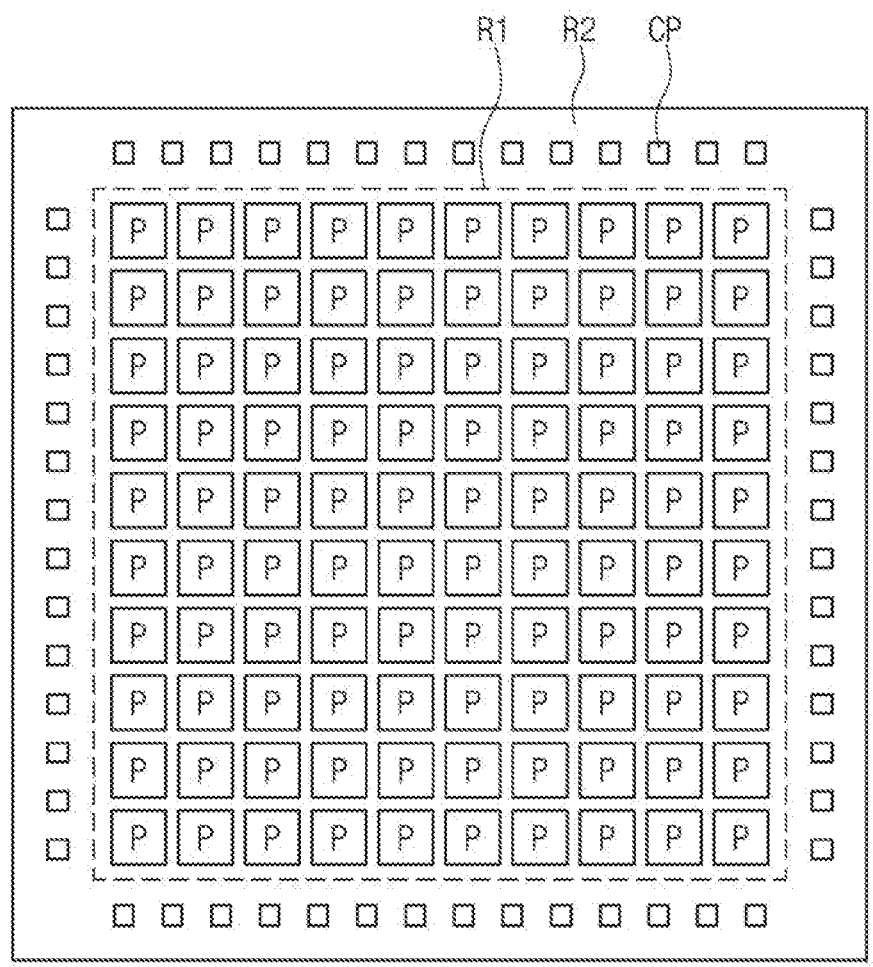
FIG. 1 illustrates a simplified plan view showing an image sensor according to some example embodiments.

FIG. 1 illustrates a simplified plan view showing an image sensor according to some example embodiments.

Referring to FIG. 1, an image sensor may include a pixel array region R1 and a pad region R2.

A plurality of unit pixels P may be two-dimensionally arranged along row and column directions on the pixel array region R1. Each unit pixel P of the pixel array region R1 may output electrical signals converted from incident light. The pixel array region R1 may include a central region (see CR of FIG. 11) and an edge region (see ER of FIG. 11) that surrounds the central region CR. For example, when viewed in plan, the edge region ER may be disposed on top, bottom, left, and right sides of the central region CR. The pad region R2 may include a plurality of conductive pads CP used to input and output control signals and photoelectric conversion signals. For easy connection with external devices, when viewed in plan, the pad region R2 may surround the pixel array region R1.

Figure 2A:
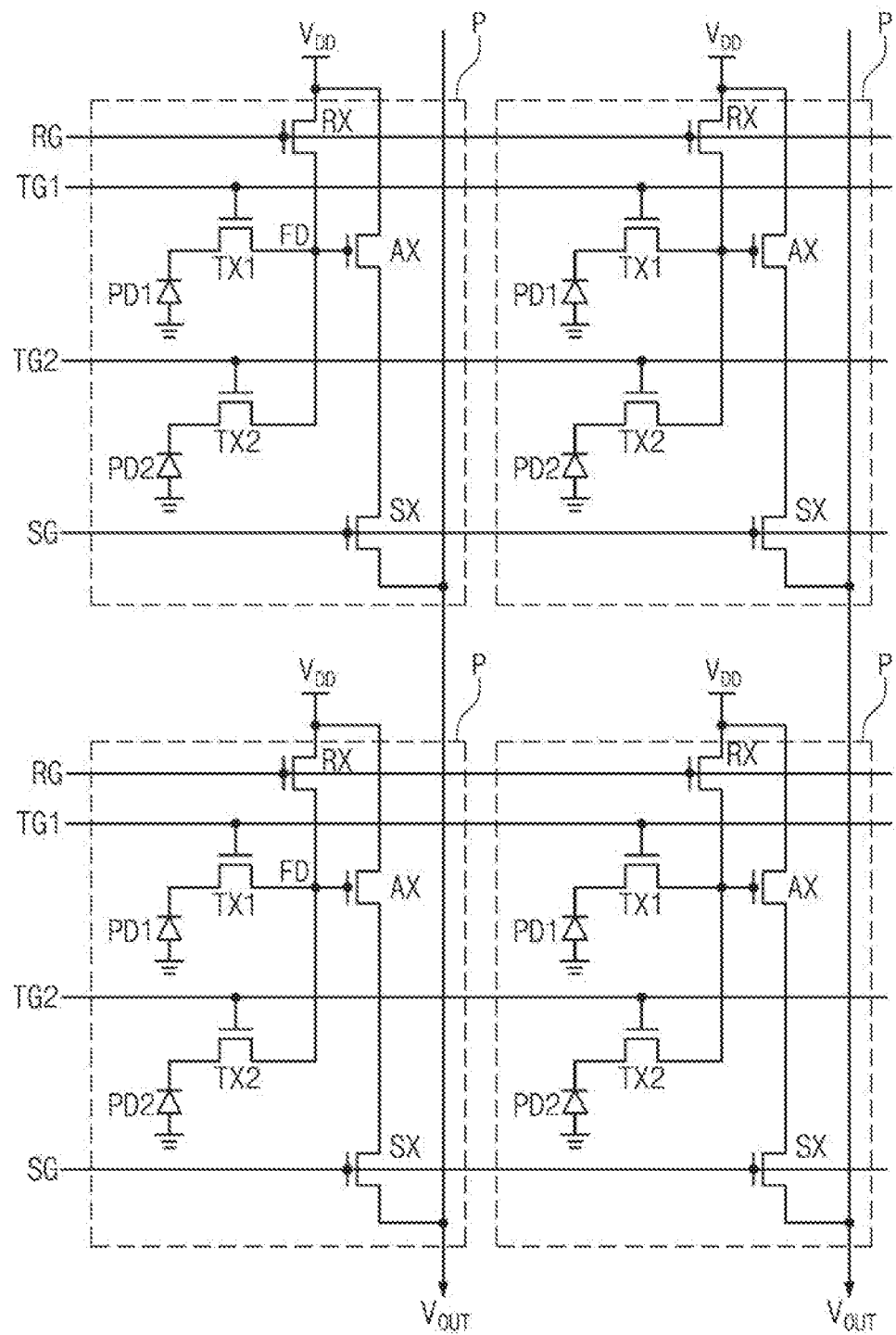

FIGS. 2A and 2B illustrate circuit diagrams showing an active pixel sensor array of an image sensor according to some example embodiments.

Referring to FIG. 2A, an active pixel sensor array may include a plurality of unit pixels P, each of which unit pixels P may include a first photoelectric conversion element PD1 and a second photoelectric conversion element PD2, a first transfer transistor TX1 and a second transfer transistor TX2, and logic transistors RX, SX, and DX. The logic transistors RX, SX and DX may include a reset transistor RX, a selection transistor SX, and an amplifier transistor AX. Gate electrodes of the first and second transfer transistors TX1 and TX2, a gate electrode of the reset transistor RX, and a gate electrode of the selection transistor SX may be correspondingly connected to drive signal lines TG1, TG2, RG, and SG, respectively.

The first transfer transistor TX1 may include a first transfer gate connected to the drive signal line TG1. The first transfer transistor TX1 may be connected to the first photoelectric conversion element PD1. The second transfer transistor TX2 may include a second transfer gate connected to the drive signal line TG2. The second transfer transistor TX2 may be connected to the second photoelectric conversion element PD2. The first and second transfer transistors TX1 and TX2 may share a charge detection node FD (i.e., a floating diffusion region).

The first and second photoelectric conversion elements PD1 and PD2 may generate and accumulate photo-charges in proportion to an amount of externally incident light thereon. The first and second transfer gates TG1 and TG2 may transfer the charges accumulated in the first and second photoelectric conversion elements PD1 and PD2 to the charge detection node FD (i.e., the floating diffusion region). The first and second transfer gates TG1 and TG2 may receive complementary signals. For example, the charges may be transferred to the charge detection node FD from one of the first and second photoelectric conversion elements PD1 and PD2. At a later time, the charges may be transferred to the charge detection node FD from the other one of the first and second photoelectric conversion elements PD1 and PD2.

The charge detection node FD may receive and accumulate the charges generated from the first and second photoelectric conversion elements PD1 and PD2. The amplifier transistor AX may be controlled by an amount of photo-charges accumulated in the charge detection node FD.

The reset transistor RX may periodically reset the charges accumulated in the charge detection node FD. For example, the reset transistor RX may have a drain electrode connected to the charge detection node FD and a source electrode connected to a power voltage $V_{DD}$. When the reset transistor RX is turned on, the charge detection node FD may receive the power voltage $V_{DD}$ connected to the source electrode of the reset transistor RX. Accordingly, when the reset transistor RX is turned on, the charges accumulated in the charge detection node FD may be exhausted and thus the charge detection node FD may be reset.

The amplifier transistor AX may amplify a variation in electrical potential at the charge detection node FD, and may output the amplified signal or a pixel signal through the selection transistor SX to an output line $V_{OUT}$. The amplifier transistor AX may be a source follower buffer amplifier configured to generate a source-drain current in proportion to an amount of photo-charges applied to a gate electrode. The amplifier transistor AX may have a gate electrode connected to the charge detection node FD, a drain electrode connected to the power voltage $V_{DD}$, and a source electrode connected to a drain electrode of the selection transistor SX.

The selection transistor SX may select each row of the unit pixel P to be readout. When the selection transistor SX is turned on, the power voltage $V_{DD}$ connected to the drain electrode of the amplifier transistor AX may be transferred to the drain electrode of the selection transistor SX.

Referring to FIG. 2B, an active pixel sensor array may include a plurality of unit pixels P, and each unit pixel P may include four photoelectric conversion elements PD1, PD2, PD3, and PD4 and four transfer transistors TX1, TX2, TX3, and TX4. The four transfer transistors TX1, TX2, TX3, and TX4 may share a charge detection node FD and logic transistors RX, SX, and DX. In the example embodiment shown in FIG. 2B, depending on signals applied to four transfer transistors TX1, TX2, TX3, and TX4, charges may be transferred to the charge detection node FD from one of four photoelectric conversion elements PD1, PD2, PD3, and PD4.

Figure 3:
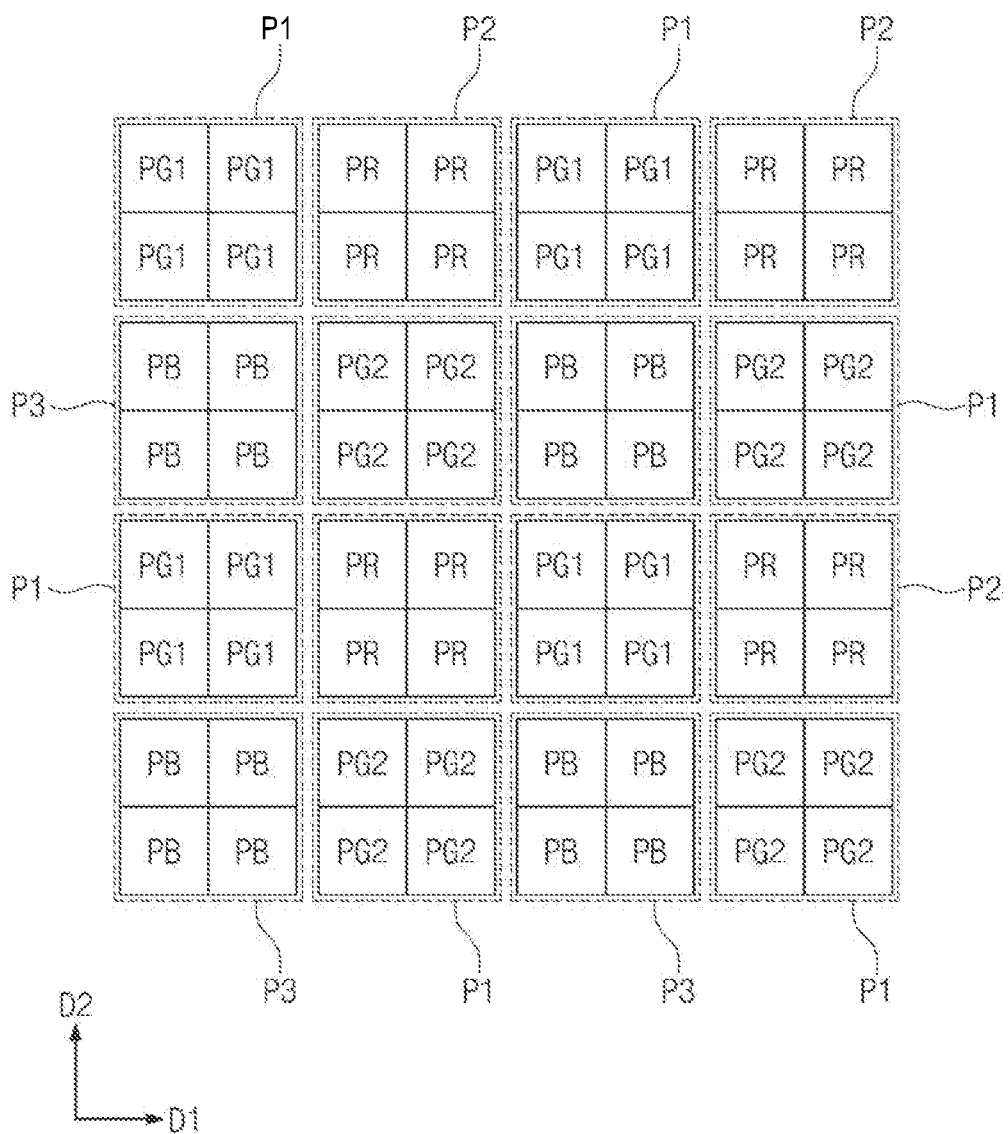
FIG. 3 illustrates a simplified plan view showing an active pixel sensor array of an image sensor according to some example embodiments.

FIG. 3 illustrates a simplified plan view showing an active pixel sensor array of an image sensor according to some example embodiments.

Referring to FIG. 3, an active pixel sensor array may include a plurality of pixel regions P1, P2, and P3 that are arranged in a matrix shape along a first direction D1 and a second direction D2. The plurality of pixel regions P1, P2, and P3 may include a first pixel region P1, a second pixel region P2, and a third pixel region P3, each of the first, second, and third pixel regions P1, P2, and P3 may receive light whose wavelength band is different from that of light that is incident on other ones of the first, second, and third pixel regions P1, P2, and P3.

In some example embodiments, the number of the first pixel regions P1 may be twice greater than the number of the second pixel regions P2 or the number of the third pixel regions P3. The first pixel regions P1 may be disposed in a diagonal direction, and the second and third pixel regions P2 and P3 may be disposed in a diagonal direction. Each of the first pixel regions P1 may be disposed between the second pixel regions P2 in the first direction D1 (or in the second direction D2) and between the third pixel regions P3 in the second direction D2 (or in the first direction D1), as illustrated in FIG. 3.

Each of the first, second, and third pixel regions P1, P2, and P3 may include a plurality of sub-pixel regions PG1/PG2, PB, or PR. For example, each of the first, second, and third pixel regions P1, P2, and P3 may include the plurality of sub-pixel regions PG1/PG2, PB, or PR that are arranged in a 2×2 tetra matrix shape. To be specific, in some example embodiments, each of the first pixel regions P1 may include a plurality of first sub-pixels PG1 or PG2, and each of the second pixel regions P2 may include a plurality of second sub-pixel regions PR. Each of the third pixel regions P3 may include a plurality of third sub-pixel regions PB.

The first sub-pixel regions PG1/PG2 may receive light with a first wavelength band, and the second sub-pixel regions PR may receive light with a second wavelength band longer than the first wavelength band. The third sub-pixel region PB may receive light with a third wavelength band shorter than the first wavelength band. For example, a green light may be incident onto the first sub-pixel regions PG1/PG2, a red light may be incident onto the second sub-pixel region PR, and a blue light may be incident onto the third sub-pixel region PB.

In certain example embodiments, each of the first, second, and third sub-pixel regions PG1/PG2, PR, and PB may include a photoelectric conversion element and a transfer transistor discussed above with reference to FIG. 2A or 2B. For example, each of the first, second, and third sub-pixel regions PG1/PG2, PR, and PB may include a unit pixel discussed with reference to FIG. 2A or 2B.

Figure 4B:
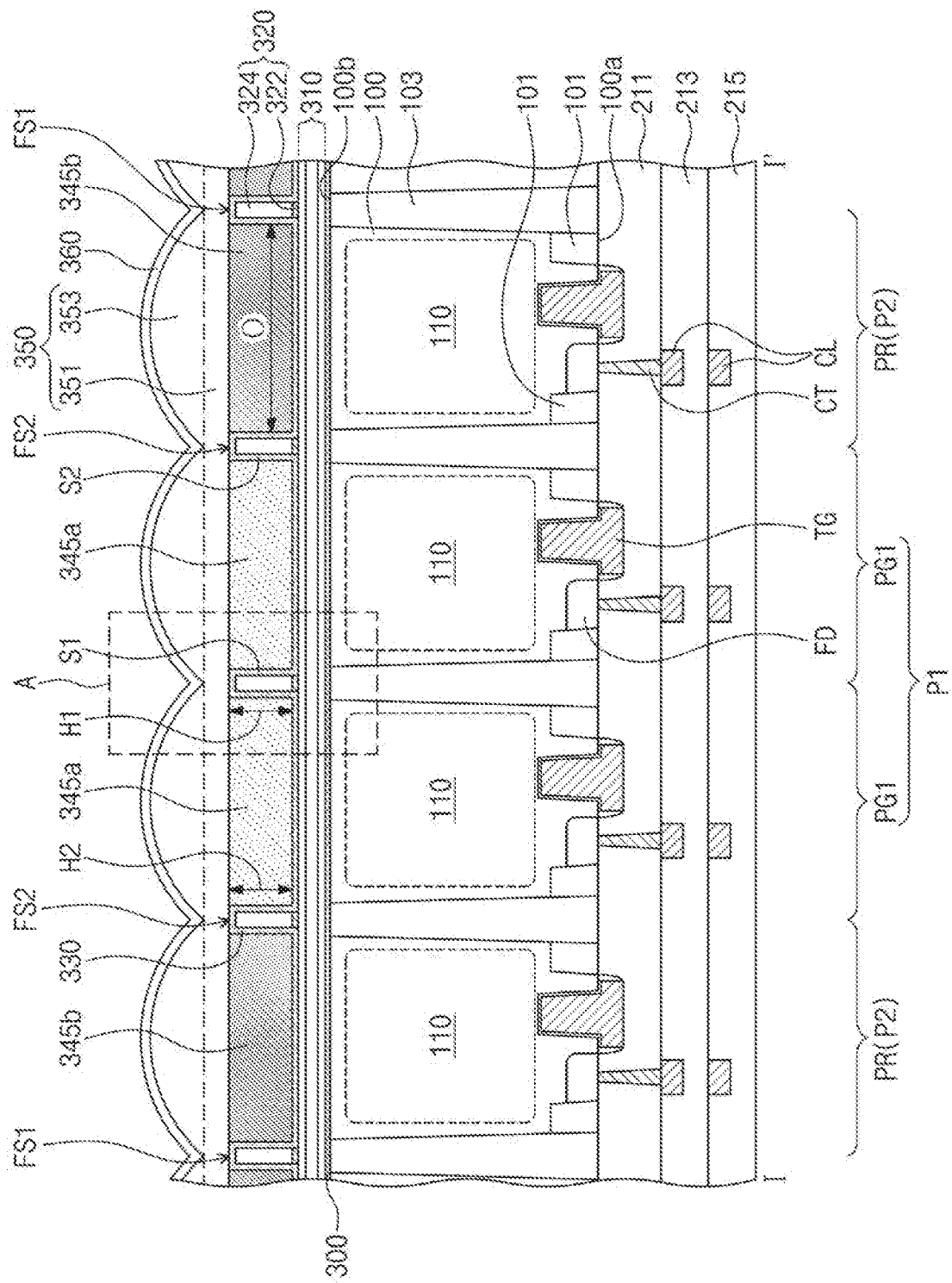
FIG. 4B illustrates a cross-sectional view taken along line I-I' of FIG. 4A, showing an image sensor according to some example embodiments.
Figure 5A:
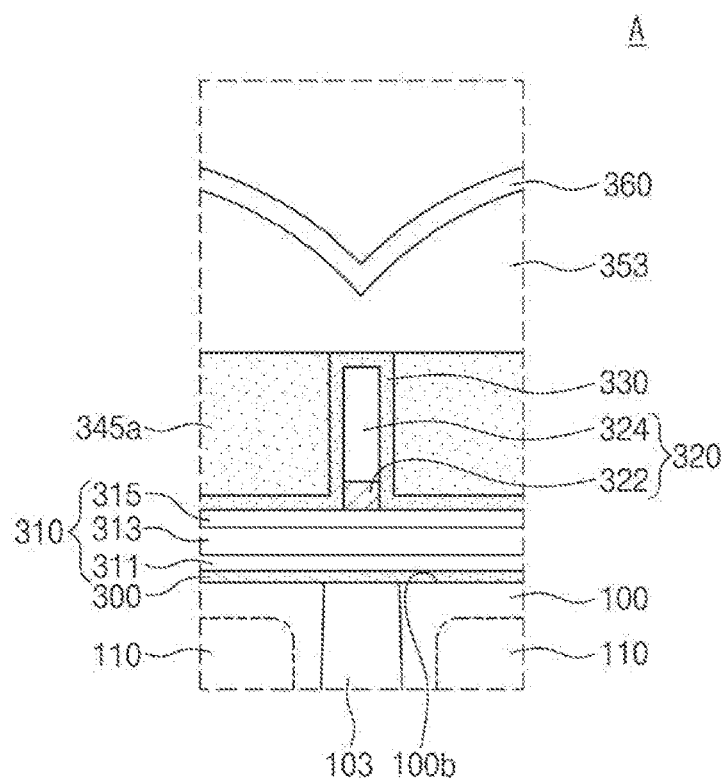
FIGS. 5A to 5C illustrate enlarged views showing section A of FIG. 4B.
Figure 5B:
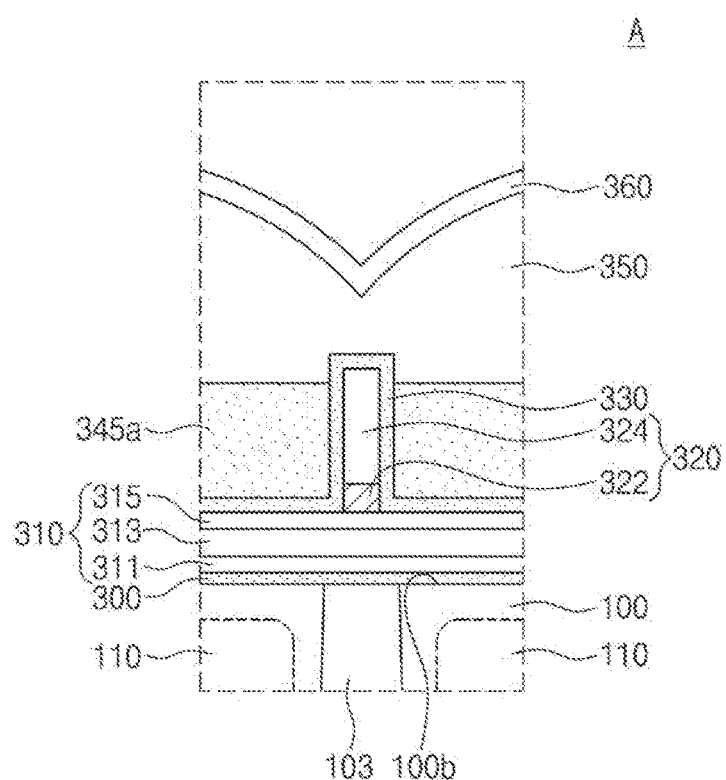
Figure 5C:
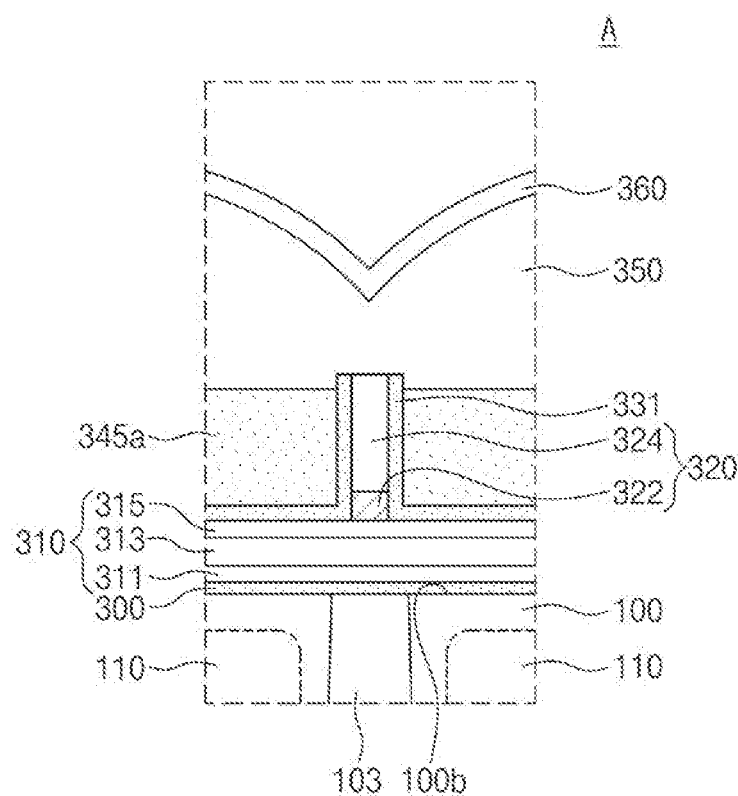

FIG. 4A illustrates a plan view showing an image sensor according to some example embodiments. FIG. 4B illustrates a cross-sectional view taken along line I-I' of FIG. 4A, showing an image sensor according to some example embodiments. FIGS. 5A to 5C illustrate enlarged views showing section A of FIG. 4B.

Referring to FIGS. 4A and 4B, an image sensor according to some example embodiments may include a semiconductor substrate 100. The semiconductor substrate 100 may have a first surface 100a and a second surface 100b opposite to each other. Photoelectric conversion regions 110 may be provided on the semiconductor substrate 100. A readout circuit layer may be provided on the first surface 100a (or front surface) of the semiconductor substrate 100, and a light-transmissive layer may be provided on the second surface 100b (or rear surface) of the semiconductor substrate 100.

The semiconductor substrate 100 may be a first-conductivity-type (e.g., p-type) bulk silicon substrate on which is formed an epitaxial layer having the first conductivity type. Alternatively, the semiconductor substrate 100 may be a p-type epitaxial layer that remains after a bulk silicon substrate is removed in fabrication processes for image sensors. Alternatively, the semiconductor substrate 100 may be a bulk semiconductor substrate that includes a first-conductivity-type well.

As discussed above by referring to FIG. 3, the semiconductor substrate 100 may include the first, second, and third pixel regions P1, P2, and P3 arranged in a tetra matrix, and each of the first, second, and third pixel regions P1, P2, and P3 may receive light whose wavelength band is different from that of light that is incident onto other ones of the first, second, and third pixel regions P1, P2, and P3.

As discussed above, the first, second, and third pixel regions P1, P2, and P3 may include a plurality of corresponding sub-pixel regions PG1/PG2, PR, and PB, respectively. Each of the first pixel regions P1 may include a plurality of first sub-pixels PG1 or PG2, and each of the second pixel regions P2 may include a plurality of second sub-pixel regions PR. Each of the third pixel regions P3 may include a plurality of third sub-pixel regions PB. The sub-pixel regions PG1/PG2, PR, and PB respectively of the first, second, and third pixel regions P1, P2, and P3 may have the same size, and may be defined by a pixel separation structure 103. For example, at least two first sub-pixel regions PG1 may be disposed between neighboring second sub-pixel regions PR, as illustrated in FIGS. 4A and 4B.

The pixel separation structure 103 may vertically extend from the first surface 100a to the second surface 100b of the semiconductor substrate 100. The pixel separation structure 103 may penetrate the semiconductor substrate 100. In this case, the pixel separation structure 103 may have a vertical thickness substantially the same as that of the semiconductor substrate 100. Alternatively, in some example embodiments, the pixel separation structure 103 may vertically extend from the first surface 100a toward, but not reach, the second surface 100b of the semiconductor substrate 100.

In some example embodiments, the pixel separation structure 103 may have a first width adjacent to the first surface 100a of the semiconductor substrate 100 and a second width, which is less than the first width, adjacent to the second surface 100b of the semiconductor substrate 100, as illustrated in FIG. 4B. The pixel separation structure 103 may have a width that gradually decreases from the first surface 100a to the second surface 100b of the semiconductor substrate 100. Alternatively, in some example embodiments, the pixel separation structure 103 may have a uniform width and penetrate the semiconductor substrate 100.

When viewed in plan, the pixel separation structure 103 may surround each of the first, second, and third sub-pixel regions PG1/PG2, PR, and PB, as illustrated in FIG. 4A. For example, the pixel separation structure 103 may include first segments 103a that extend parallel to each other along a first direction D1 and are spaced apart from each other in a second direction D2, and also include second segments 103b that extend parallel to each other along the second direction D2 while running across the first segments 103a, and are spaced apart from each other in the first direction D1.

In certain example embodiments, each of the first, second, and third sub-pixel regions PG1/PG2, PR, and PB may have a width that corresponds to a spacing between neighboring first segments 103a and/or a spacing between neighboring second segments 103b. The first segments 103a of the pixel separation structure 103 may have a pitch ranging from, for example, about 50 μm to about 100 μm. For example, the first segments 103a of the pixel separation structure 103 may have a pitch of about 70 μm.

The pixel separation structure 103 may be formed of a dielectric material whose refractive index is less than that of the semiconductor substrate 100, and may include a single dielectric layer or a plurality of dielectric layers. For example, the semiconductor substrate 100 may be silicon. For example, the pixel separation structure 103 may be formed of a silicon oxide layer, a silicon nitride layer, an undoped polysilicon layer, air, or a combination thereof. The pixel separation structure 103 may prevent cross-talk between neighboring ones of the first, second, and third sub-pixel regions PG1/PG2, PR, and PB.

The photoelectric conversion regions 110 may be correspondingly provided on the first, second, and third sub-pixel regions PG1/PG2, PR, and PB. The photoelectric conversion regions 110 may be formed by implanting the semiconductor substrate 100 with impurities having a second conductivity type opposite to that of the semiconductor substrate 100. A photodiode may be formed at a junction between the semiconductor substrate 100 having the first conductivity type and the photoelectric conversion region 110 having the second conductivity type. The photoelectric conversion regions 110 may generate photo-charges in proportion to magnitude of incident light.

In certain example embodiments, each of the photoelectric conversion regions 110 may have a difference in impurity concentration between a portion adjacent to the first surface 100a and a portion adjacent to the second surface 100b, such that a potential slope may be provided between the first surface 100a and the second surface 100b of the semiconductor substrate 100. For example, each of the photoelectric conversion regions 110 may include a plurality of vertically stacked impurity sections.

A device isolation layer 101 may be disposed adjacent to the first surface 100a of the semiconductor substrate 100 on each of the first, second, and third sub-pixel regions PG1/PG2, PR, and PB. The device isolation layer 101 may define an active region of the semiconductor substrate 100.

Readout circuits may be disposed on the first surface 100a of the semiconductor substrate 100. The readout circuits may include MOS transistors discussed with reference to FIGS. 2A and 2B. On each of the sub-pixel regions PG1/PG2, PR, and PB, transfer gate electrodes TG may be disposed on the first surface 100a of the semiconductor substrate 100, and readout circuits discussed with reference to FIGS. 2A and 2B may also be provided on the first surface 100a of the semiconductor substrate 100.

When viewed in plan, the transfer gate electrode TG may be positioned on a central portion of each of the sub-pixel regions PG1/PG2, PR, and PB. A portion of the transfer gate electrode TG may be disposed within the semiconductor substrate 100, and a gate dielectric layer may be interposed between the transfer gate electrode TG and the semiconductor substrate 100. A floating diffusion region FD may be provided in the semiconductor substrate 100 on one side of the transfer gate electrode TG. The floating diffusion region FD may be formed by implanting the semiconductor substrate 100 with impurities whose conductivity type is opposite to that of semiconductor substrate 100. For example, the floating diffusion region FD may be an n-type impurity region.

Interlayer dielectric layers 211, 213, and 215 may be stacked on the first surface 100a of the semiconductor substrate 100, and the interlayer dielectric layers 211, 213, and 215 may cover the transfer gate electrodes TG and the MOS transistors that constitute the readout circuits. The interlayer dielectric layers 211, 213, and 215 may include, for example, one or more of silicon oxide, silicon nitride, and silicon oxynitride. Connection lines CL may be disposed on each of the interlayer dielectric layers 211, 213, and 215, and the connection lines CL may be electrically connected through contact plugs CT to the readout circuits.

A fixed charge layer 300 may be disposed on the second surface 100b of the semiconductor substrate 100. The fixed charge layer 300 may prevent the photoelectric conversion regions 110 from receiving charges (e.g., electrons or holes) generated from defects present on the second surface 100b of the semiconductor substrate 100. The fixed charge layer 300 may include a single layer or multiple layers. For example, the fixed charge layer 300 may include metal oxide or metal fluoride that includes at least one metal selected from the group consisting of hafnium (Hf), zirconium (Zr), aluminum (Al), tantalum (Ta), titanium (Ti), yttrium (Y), and lanthanide (Ln). For example, the fixed charge layer 300 may include one or more of an aluminum oxide layer and a hafnium oxide layer. The fixed charge layer 300 may have a thickness ranging from about 1 nm to about 50 nm.

A planar dielectric layer 310 may be disposed on the fixed charge layer 300. The planar dielectric layer 310 may include a first planar layer 311, a second planar layer 313, and a third planar layer 315 that are sequentially stacked (see FIG. 5A). The first, second, and third planar layers 311, 313, and 315 may include a transparent dielectric material. The first, second, and third planar layers 311, 313, and 315 may have different refractive indices from each other. The first, second, and third planar layers 311, 313, and 315 may be combined with each other to have an appropriate thickness, which results in a high refractive index. For example, the first planar layer 311 may be thicker than the fixed charge layer 300. The second planar layer 313 may be thicker than the first planar layer 311. The third planar layer 315 may be thinner than the second planar layer 313.

The first and third planar layers 311 and 315 may have the same refractive index, and the second planar layer 313 may have a different refractive index from that of the first and third planar layers 311 and 315. For example, the first and third planar layers 311 and 315 may include metal oxide, and the second planar layer 313 may include silicon oxide.

A grid structure 320 may be disposed on the planar dielectric layer 310. Similar to the pixel separation structure 103, the grid structure 320 may have a grid shape when viewed in plan. When viewed in plan, the grid structure 320 may overlap the pixel separation structure 103. For example, the grid structure 320 may include first segments that extend in the first direction D1 and second segments that extend in the second direction D2 while running across the first segments. The grid structure 320 may be disposed between the photoelectric conversion regions 110 of the sub-pixel regions PG1/PG2, PR, and PB. As illustrated in FIG. 4B, the grid structure 320 may have a width substantially the same as or less than a minimum width of the pixel separation structure 103.

The grid structure 320 may refract light that is obliquely incident through micro-lenses 353, and then may allow the refractive light to enter the photoelectric conversion regions 110 of the sub-pixel regions PG1/PG2, PR, and PB. The grid structure 320 may have an aspect ratio ranging from about 2:1 to about 5:1. The grid structure 320 may have a height ranging from about 2,000 Å to about 7,000 Å. The grid structure 320 may have a width ranging from about 50 nm to about 150 nm.

The grid structure 320 may include a light-shield pattern 322 and a low-refractive pattern 324 that are sequentially stacked on the planar dielectric layer 310. The light-shield pattern 322 may be disposed between the low-refractive pattern 324 and the planar dielectric layer 310. The light-shield pattern 322 may include a metallic material, for example, titanium, tantalum, or tungsten.

The low-refractive pattern 324 may include a material whose refractive index is less than those of color filters 345a and 345b. The low-refractive pattern 324 may include an organic material and have a refractive index ranging from about 1.1 to about 1.3. For example, the grid structure 320 may be a polymer layer including silica nano-particles. Because the low-refractive pattern 324 has a low refractive index, it may be possible to increase an amount of light that is incident onto the photoelectric conversion region 110 and to reduce cross-talk between the sub-pixel regions PG1/PG2, PR, and PB. In this configuration, each of the photoelectric conversion regions 110 may increase in light-receiving efficiency and improve in signal-to-noise ratio (SNR).

A protective layer 330 may be disposed on the planar dielectric layer 310 to cover the planar dielectric layer 310 and a surface of the grid structure 320 on the planar dielectric layer 310 with a substantially uniform thickness. For example, the protective layer 330 may extend from a space between a sidewall of any of the color filters 345a and 345b and a sidewall of the grid structure 320 toward a space between the planar dielectric layer 310 and a bottom surface of any of the color filters 345a and 345b.

The protective layer 330 may be a single layer or multiple layers including one or more of, for example, aluminum oxide and silicon carbide oxide. In some example embodiments, the protective layer 330 may have a thickness ranging from about 1 Å to about 100 Å. The protective layer 330 may protect the color filters 345a and 345b and may serve to absorb moisture. In some example embodiments, the protective layer 330 may be formed to have a thickness of about 10 Å to about 100 Å, and therefore may have no effect on pathways of light that is incident onto the sub-pixel regions PG1/PG2, PR, and PB.

In certain example embodiments, the grid structure 320 may have openings O each of which is defined by a pair of first segments of the grid structure 320 that extend in the first direction D1 and by a pair of second segments of the grid structure 320 that extend in the second direction D2, and the openings O may overlap the photoelectric conversion regions 110 of the sub-pixel regions PG1/PG2, PR, and PB.

The color filters 345a and 345b may be disposed in the openings defined by the grid structure 320. For example, first color filters 345a may be provided on corresponding first sub-pixel regions PG1/PG2 of the first pixel region P1, and second color filters 345b may be provided on corresponding second sub-pixel regions PR of the second pixel region P2. Likewise, third color filters (not shown in FIG. 4B) may be provided on corresponding third sub-pixel regions PB of the third pixel region (see P3 of FIG. 3). The first color filter 345a, the second color filter 345b, and the third color filter may respectively include a green color filter, a red color filter, and a blue color filter. Alternatively, the first color filter 345a, the second color filter 345b, and the third color filter may include magenta, yellow, and cyan color filters, respectively. Although three types of color filters are provided as mentioned above, in certain example embodiments four types of color filters may be provided.

In certain example embodiments, at least two first color filters 345a may be disposed between neighboring second color filters 345b, as illustrated in FIG. 4B. The grid structure 320 may include first fence segments FS1 provided between the sub-pixel regions PG1/PG2, PR, and PB of the pixel regions P1, P2, and P3, and also include second fence segments FS2 provided between different pixel regions P1, P2, and P3. For example, the first fence segments FS1 of the grid structure 320 may be provided between the color filters 345a or 345b whose colors are the same as each other, and the second fence segments FS2 of the grid structure 320 may be provided between the color filters 345a and 345b whose colors are different from each other.

Each of the color filters 345a and 345b may have a first sidewall S1 adjacent to the first fence segment FS1 of the grid structure 320 and a second sidewall S2 adjacent to the second fence segment FS2 of the grid structure 320. The first sidewall S1 may have a height H1 substantially the same as a height H2 of the second sidewall S2. For example, a difference between the first and second heights H1 and H2 of the first and second sidewalls S1 and S2 may range from about 10 Å to about 100 Å. Each of the color filters 345a and 345b may have a substantially flat top surface, and the top surfaces of the color filters 345a and 345b may be parallel to the bottom surfaces of the color filters 345a and 345b.

Referring to FIGS. 4B and 5A, the protective layer 330 may cover a top surface of the grid structure 320, and the top surfaces of the color filters 345a and 345b may be substantially coplanar with a top surface of the protective layer 330 positioned on the top surface of the grid structure 320. For example, the top surface of the grid structure 320 may be located at substantially the same level as that of the top surface of the protective layer 330. Referring to FIG. 5B, the top surfaces of the color filters 345a and 345b may be located at a level lower than a level of the top surface of the grid structure 320. Referring to FIG. 5C, a protective pattern 331 may directly cover the sidewalls of the grid structure 320 and the bottom surfaces of the color filters 345a and 345b. That is, unlike the protective pattern 330, in some example embodiments, the protective pattern 331 may not be provided along the top surface of the grid structure 320. A top surface of the protective pattern 331 may be located at substantially the same level as that of the top surface of the grid structure 320, and the top surfaces of the color filters 345a and 345b may be located at a level lower than a level of the top surface of the grid structure 320.

Referring back to FIGS. 4A and 4B, a micro-lens array 350 may be disposed on a color filter array including the first color filters 345a, the second color filters 345b, and the third color filters. The micro-lens array 350 may include a planar segment 351 adjacent to the color filters 345a and 345b, and also include micro-lenses 353 on the planar segment 351 that correspond to the sub-pixel regions PG1/PG2, PR, and PB.

Because the first color filters 345a, the second color filters 345b, and the third color filters have substantially flat top surfaces, the planar segment 351 may have a substantially uniform thickness on the top surfaces of the first color filters 345a, the second color filters 345b, and the third color filters. For example, the planar segment 351 may have substantially the same thickness on the first and second sidewalls S1 and S2 of each of the color filters 345a and 345b. The micro-lenses 353 may be correspondingly provided on the sub-pixel regions PG1/PG2, PR, and PB, and may each have an upwardly convex shape. In certain example embodiments, because the planar segment 351 has a reduced distribution in thickness on the micro-lens array 350, it may be possible to increase light collection efficiency through the micro-lenses 353.

A passivation layer 360 may conformally cover a top surface of the micro-lens array 350. The passivation layer 360 may be formed of, for example, an inorganic oxide.

In the description that follows, the same features as those of the image sensor discussed above may be omitted in some cases in the interest of brevity of description.

Figure 7A:
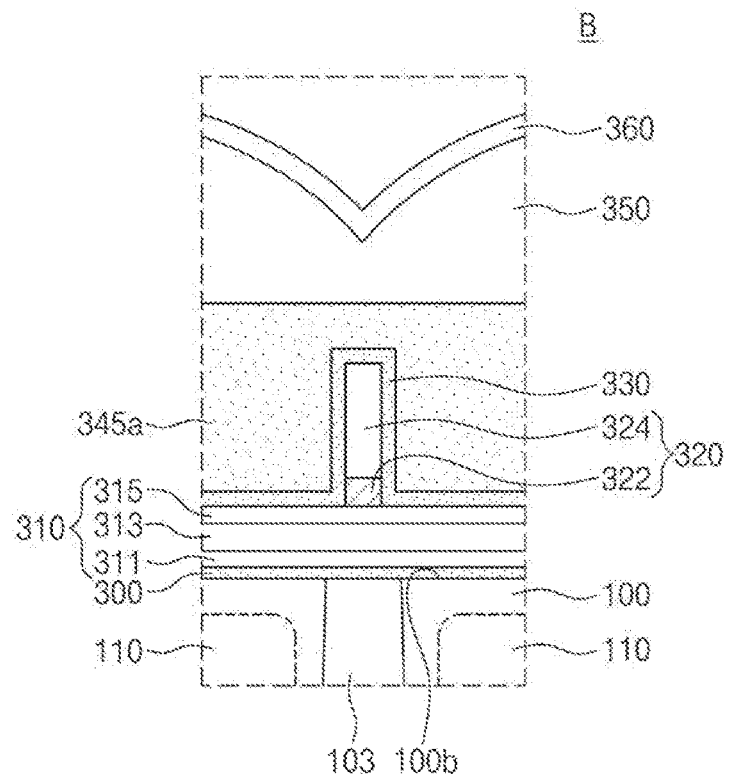
FIGS. 7A and 7B illustrate enlarged views showing section B of FIG. 6.
Figure 7B:
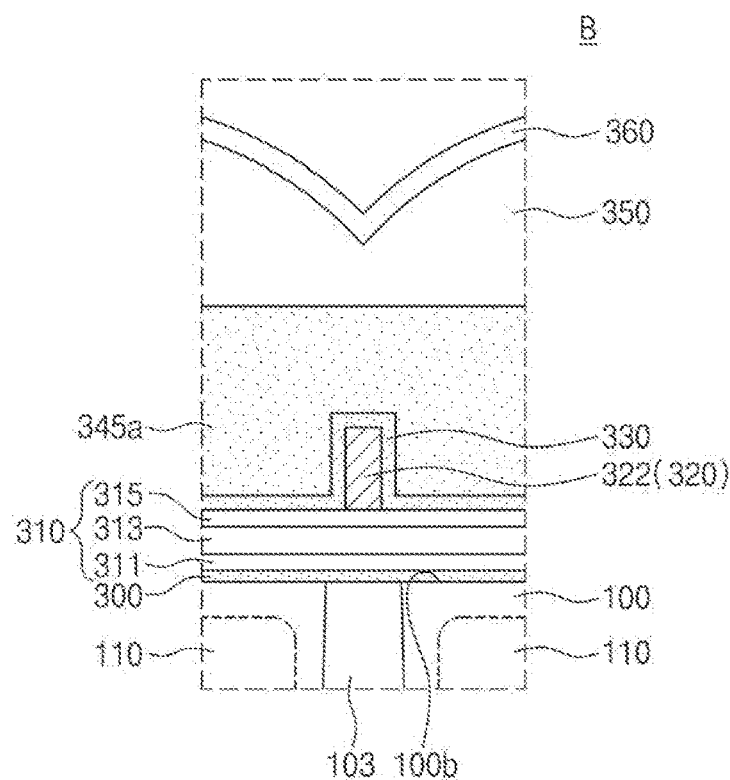

FIG. 6 illustrates a cross-sectional view taken along line I-I' of FIG. 4A, showing an image sensor according to some example embodiments. FIGS. 7A and 7B illustrate enlarged views showing section B of FIG. 6.

Referring to FIGS. 6, 7A, and 7B, as discussed above, each of the color filters 345a and 345b may have a substantially flat top surface. In addition, the top surfaces of the color filters 345a and 345b may be located at a level higher than a level of the top surface of the grid structure 320, as illustrated in FIG. 6. The grid structure 320 may have a height less than thicknesses of the color filters 345a and 345b. The thickness of each of the color filters 345a and 345b on the planar dielectric layer 310 may be different from that of each of the color filters 345a and 345b on the grid structure 320.

The first color filter 345a may be provided on the first pixel region P1 and on a plurality of first sub-pixel regions PG1. The first color filter 345a may be connected or continuous on the first fence segment FS1 of the grid structure 320, which first fence segment FS1 is provided between the first sub-pixel regions PG1. For example, on each of the first sub-pixel regions PG1, the first color filter 345a may cover a top surface of the first fence segment FS1 of the grid structure 320 (see, e.g., the middle grid structure 320 in FIG. 6). Even though each of the color filters 345a and 345b covers the first fence segment FS1 of the grid structure 320, a difference in height between the first and second sidewalls S1 and S2 adjacent to the first and second fence segments FS2 of the grid structure 320 may range from about 10 Å to about 100 Å.

Referring to FIG. 7A, the grid structure 320 may include the light-shield pattern 322 and the low-refractive pattern 324 that are sequentially stacked. The low-refractive pattern 324 may have a height ranging from about 3,000 Å to about 5,000 Å. The color filters 345a and 345b may have a thickness ranging from about 5,000 Å to about 5,500 Å. Referring to FIG. 7B, in some example embodiments, the grid structure 320 may include a metallic material, and have a height ranging from about 2,000 Å to about 3,000 Å.

Figure 8:
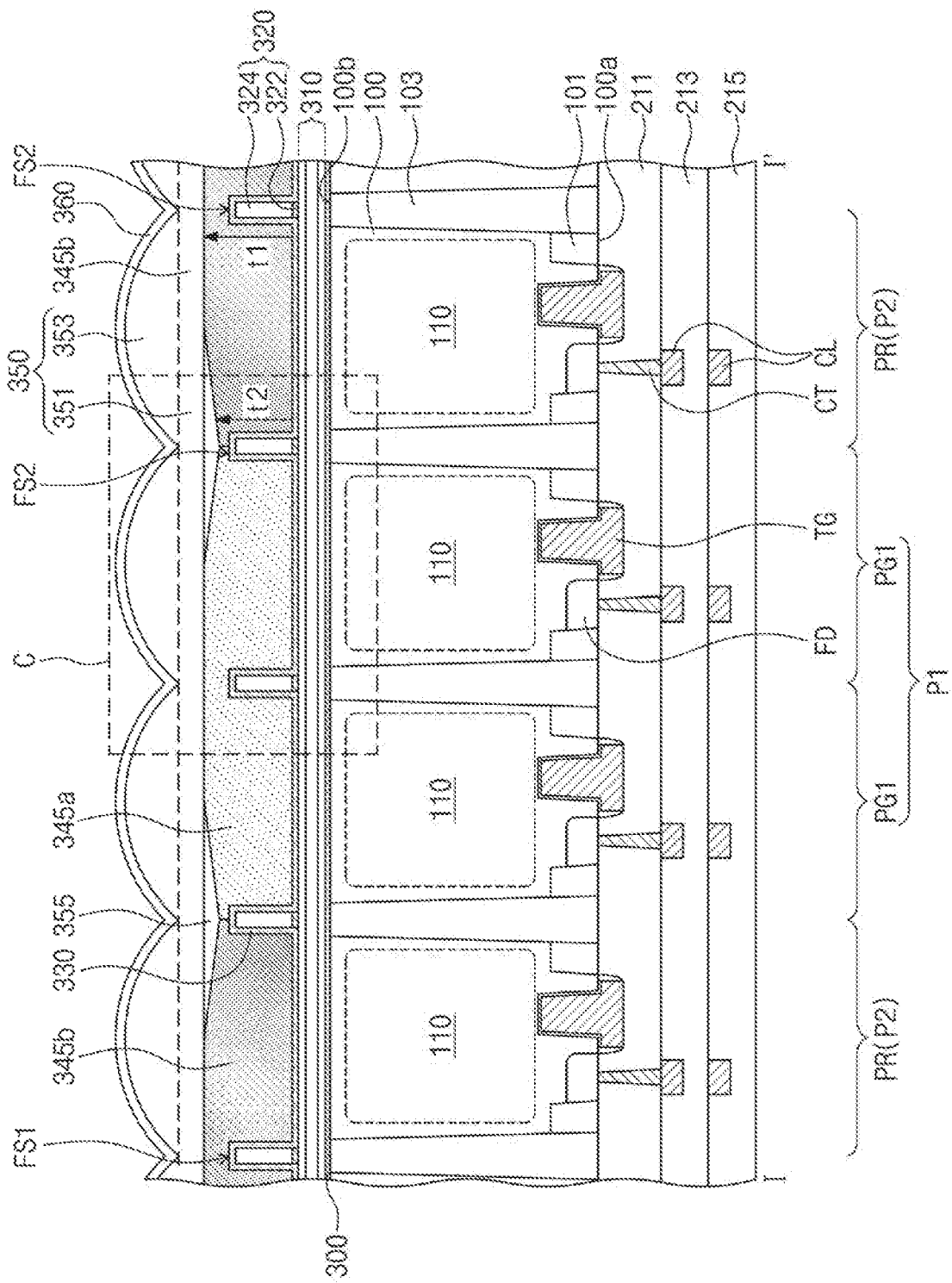
FIG. 8 illustrates a cross-sectional view taken along line I-I' of FIG. 4A, showing an image sensor according to some example embodiments.
Figure 9A:
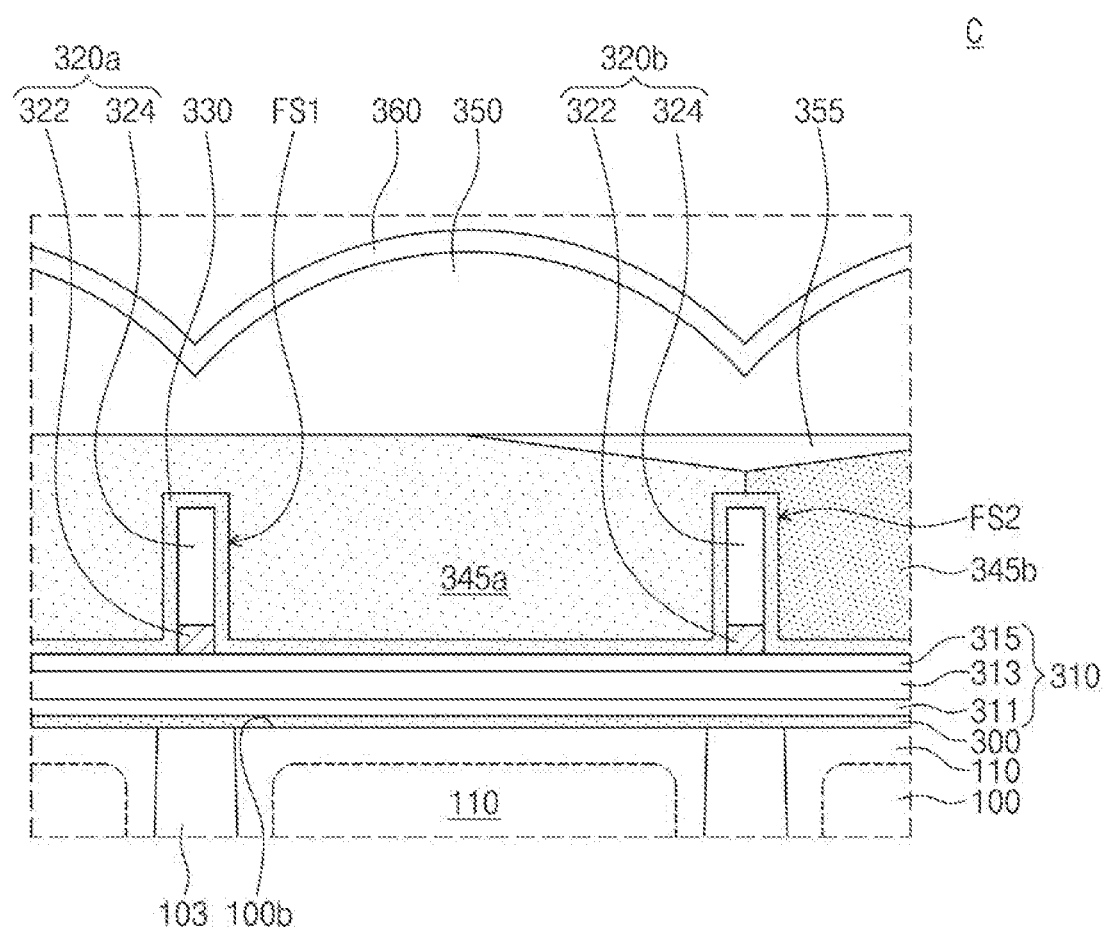

FIG. 8 illustrates a cross-sectional view taken along line I-I' of FIG. 4A, showing an image sensor according to some example embodiments. FIGS. 9A and 9B illustrate enlarged views showing section C of FIG. 8.

Referring to FIG. 8, each of the color filters 345a and 345b may have different thicknesses at portions respectively adjacent to the first and second fence segments FS1 and FS2 of the grid structure 320. In other words, a thickness t1 of each of the color filters 345a and 345b adjacent to the first fence segment FS1 may be greater than a thickness t2 of each of the color filters 345a and 345b adjacent to the second fence segment FS2, as shown in FIG. 8. A sacrificial planar layer 355 may partially remain between adjacent first and second color filters 345a and 345b. The sacrificial planar layer 355 may have a top surface substantially coplanar with uppermost surfaces of the first and second color filters 345a and 345b.

Referring to FIG. 9A, in some example embodiments, each of the color filters 345a and 345b may have minimum and maximum thicknesses that are both greater than the height of the grid structure 320. Each of the color filters 345a and 345b may have the maximum thickness at a portion adjacent to a first fence segment FS1 320a of the grid structure 320, and have the minimum thickness at a portion adjacent to a second fence segment FS2 320b of the grid structure 320. A difference between the maximum and minimum thicknesses of each of the color filters 345a and 345b may range from about 10 Å to about 100 Å.

Referring to FIG. 9B, in some example embodiments, each of the color filters 345a and 345b may have an uppermost surface at a level substantially the same as that of the top surface of the protective layer 330 that covers the top surface of the grid structure 320. In this configuration, the minimum thickness of each of the color filters 345a and 345b may be less than the height of the grid structure 320.

Figure 10B:
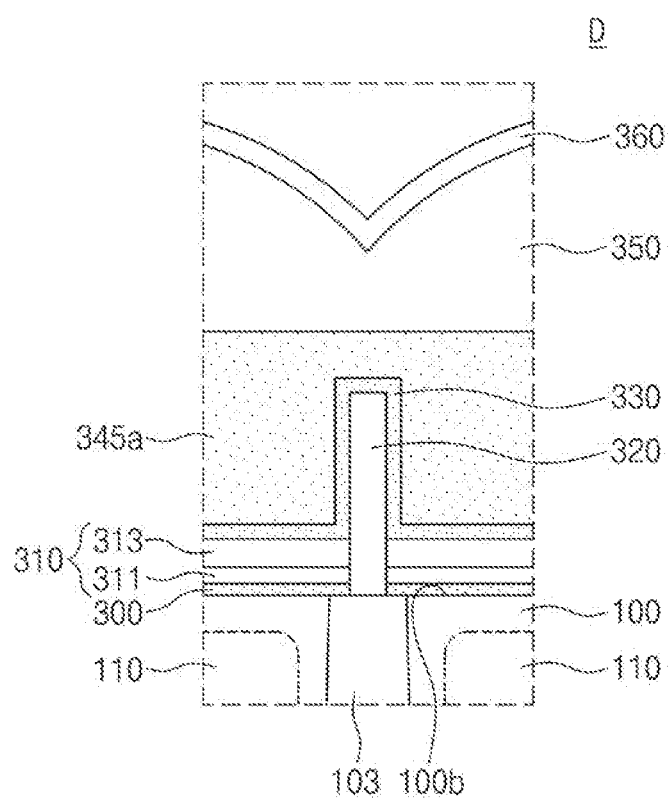
FIG. 10B illustrates an enlarged view showing section D of FIG. 10A.

FIG. 10A illustrates a cross-sectional view taken along line I-I' of FIG. 4A, showing an image sensor according to some example embodiments. FIG. 10B illustrates an enlarged view showing section D of FIG. 10A.

Referring to FIG. 10A, the planar dielectric layer 310 may be disposed on the second surface 100b of the semiconductor substrate 100, and the grid structure 320 may have a lower portion within the planar dielectric layer 310. For example, the lower portion of the grid structure 320 may penetrate the planar dielectric layer 310.

The fixed charge layer 300 may be disposed between the planar dielectric layer 310 and the second surface 100b of the semiconductor substrate 100, and the grid structure 320 may have a bottom surface in contact with the fixed charge layer 300. Alternatively, in some example embodiments, the bottom surface of the grid structure 320 may be in contact with the pixel separation structure 103. The planar dielectric layer 310 may include the first planar layer 311 and the second planar layer 313 that are sequentially stacked. The first and second planar layers 311 and 313 may have different refractive indices and different thicknesses.

The grid structure 320 may include a material whose refractive index is less than that of the semiconductor substrate 100. For example, the semiconductor substrate 100 may be, for example, silicon. For example, the grid structure 320 may be formed of a low-refractive material whose refractive index is about 1.3 or less. For example, the grid structure 320 may be a polymer layer including silica nano-particles.

Figure 11:
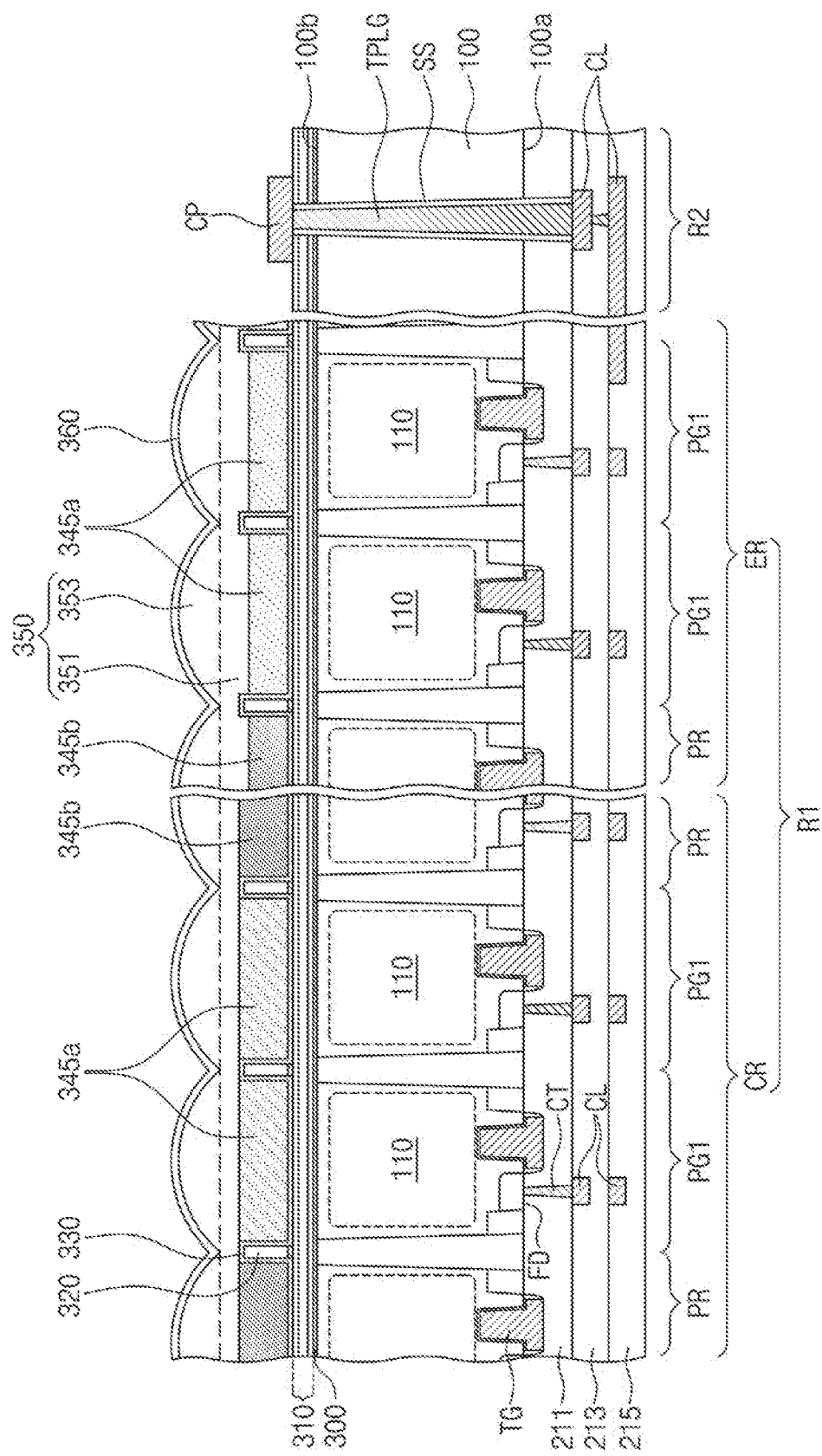
FIG. 11 illustrates a cross-sectional view showing an image sensor according to some example embodiments.

FIG. 11 illustrates a cross-sectional view showing an image sensor according to some example embodiments.

Referring to FIG. 11, as discussed above with reference to FIG. 1, the semiconductor substrate 100 may include the pixel array region R1 and the pad region R2 around the pixel array region R1, and the pixel array region R1 may include the central region CR and the edge region ER that surrounds the central region CR and is adjacent to the pad region R2.

The color filters 345a and 345b may have substantially flat top surfaces on the central and edge regions CR and ER. The color filters 345a and 345b may have a relatively smaller thickness on the edge region ER and a relatively larger thickness on the central region CR, as illustrated in FIG. 11. For example, on the central region CR, the top surfaces of the color filters 345a and 345b may be located at a level substantially the same as that of the top surface of the protective layer 330, and on the edge region ER, the top surfaces of the color filters 345a and 345b may be located at a level lower than that of the top surface of the grid structure 320.

On the pad region R2, a through plug TPLG may be provided to penetrate the semiconductor substrate 100, and a sidewall dielectric layer SS may surround a sidewall of the through plug TPLG. On the pad region R2, a connection line CL may be disposed on the first surface 100a of the semiconductor substrate 100, and a conductive pad CP may be disposed on the second surface 100b of the semiconductor substrate 100. The connection line CL of the pad region R2 may be connected to the connection line CL of the pixel array region R1. The through plug TPLG may electrically connect the connection line CL to the conductive pad CP.

Figure 12A:
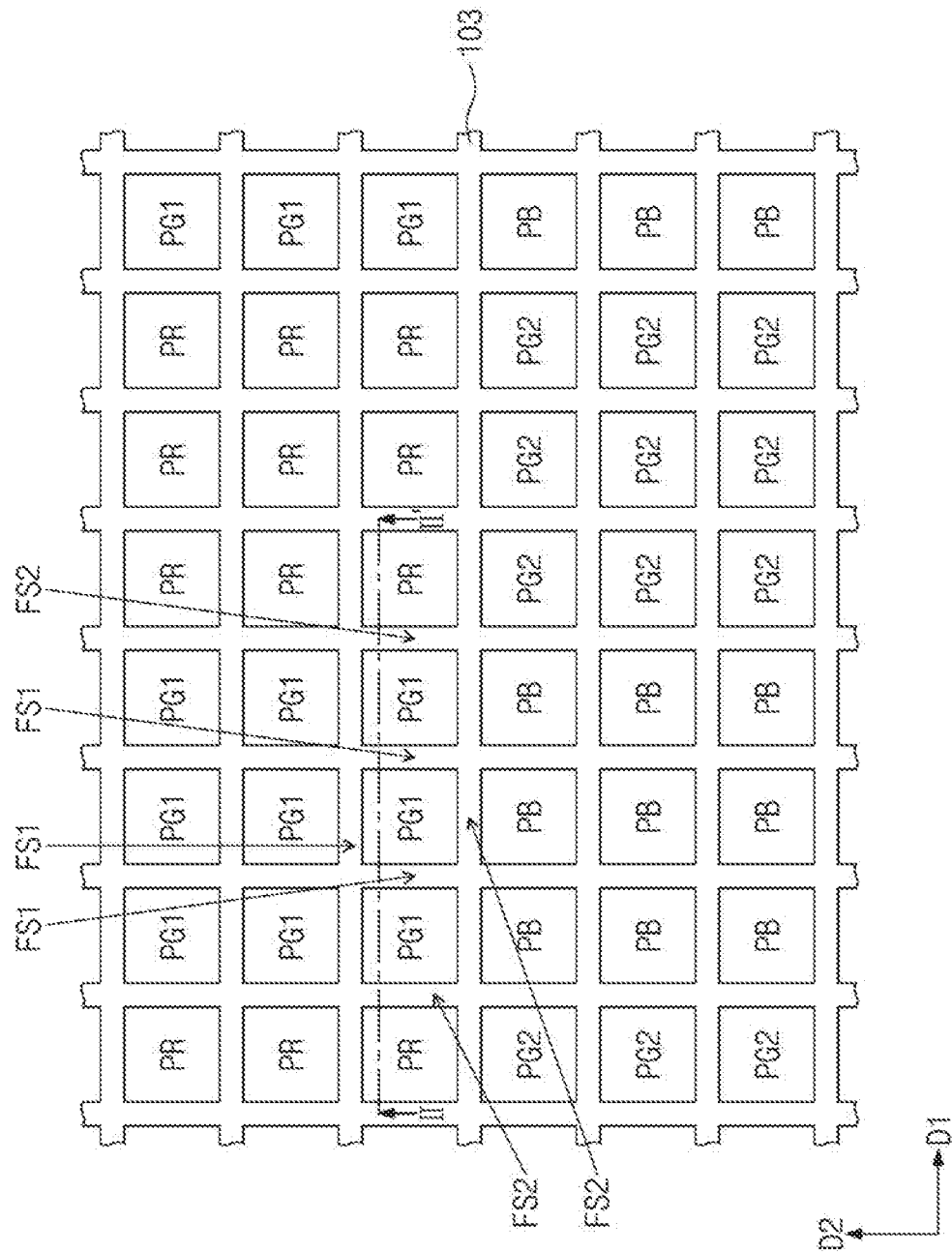
FIG. 12A illustrates a plan view showing an image sensor according to some example embodiments.
Figure 12B:
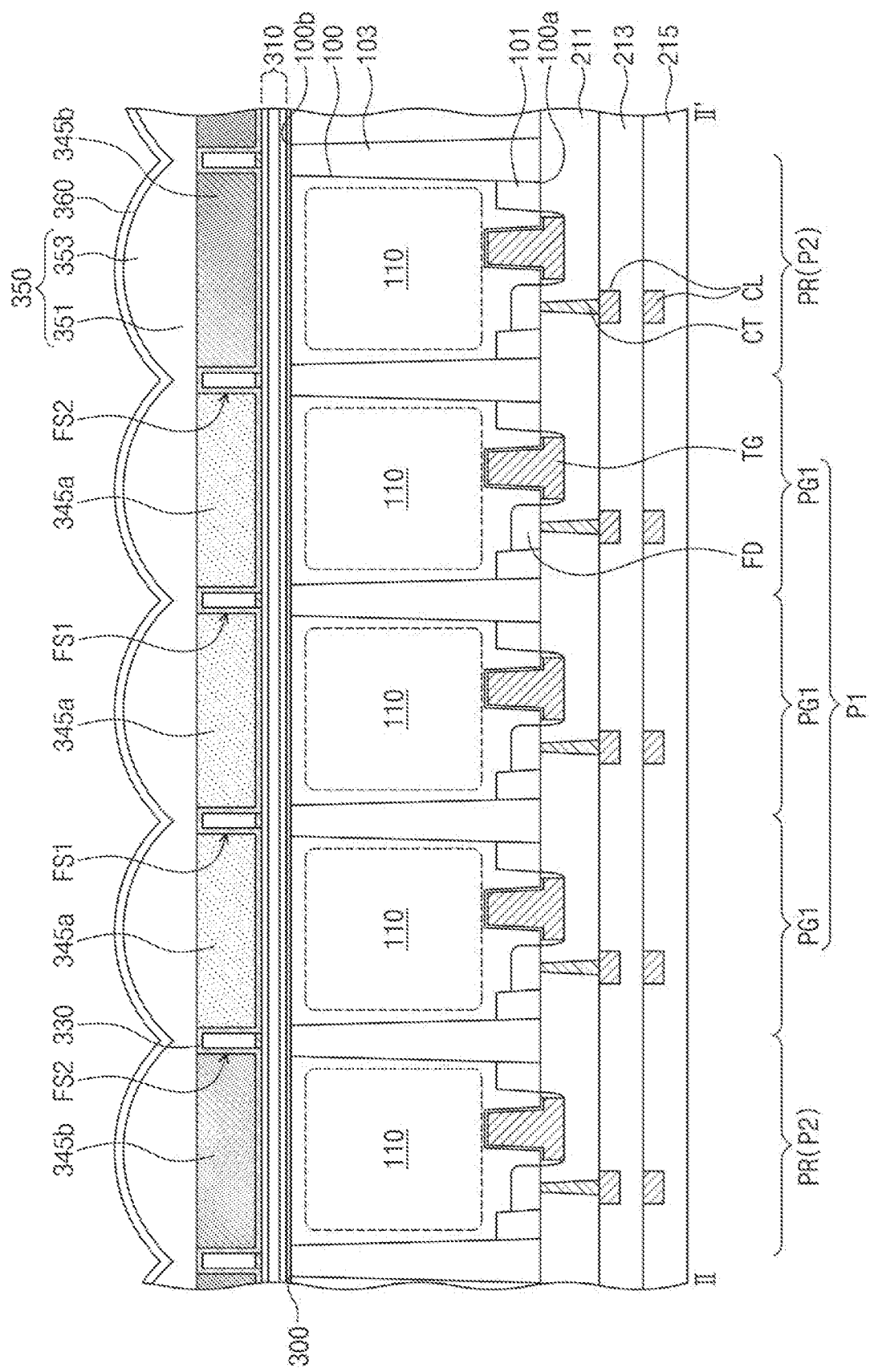
FIG. 12B illustrates a cross-sectional view taken along line II-IF of FIG. 12A, showing an image sensor according to some example embodiments.

FIG. 12A illustrates a plan view showing an image sensor according to some example embodiments. FIG. 12B illustrates a cross-sectional view taken along line II-IF of FIG. 12A, showing an image sensor according to some example embodiments.

Referring to FIGS. 12A and 12B, each of the first, second, and third pixel regions P1, P2, and P3 discussed above with reference to FIG. 3 may include corresponding ones of the sub-pixel regions PG1/PG2, PR, and PB, which corresponding sub-pixel regions are arranged in a 3×3 matrix shape. For example, at least three first sub-pixel regions PG1/PG2 may be disposed between neighboring second sub-pixel regions PR.

The grid structure 320 may include first fence segments FS1 provided between the sub-pixel regions PG1/PG2, PR, and PB, and also include second fence segments FS2 provided between the pixel regions P1, P2, and P3. In this configuration, at least two first fence segments FS1 may be disposed between the second fence segments FS2 that are spaced apart from each other.

As discussed above, the color filters 345a and 345b may fill the openings defined by the grin structure 320, and each of the color filters 345a and 345b may have a substantially flat surface.

Figure 13:
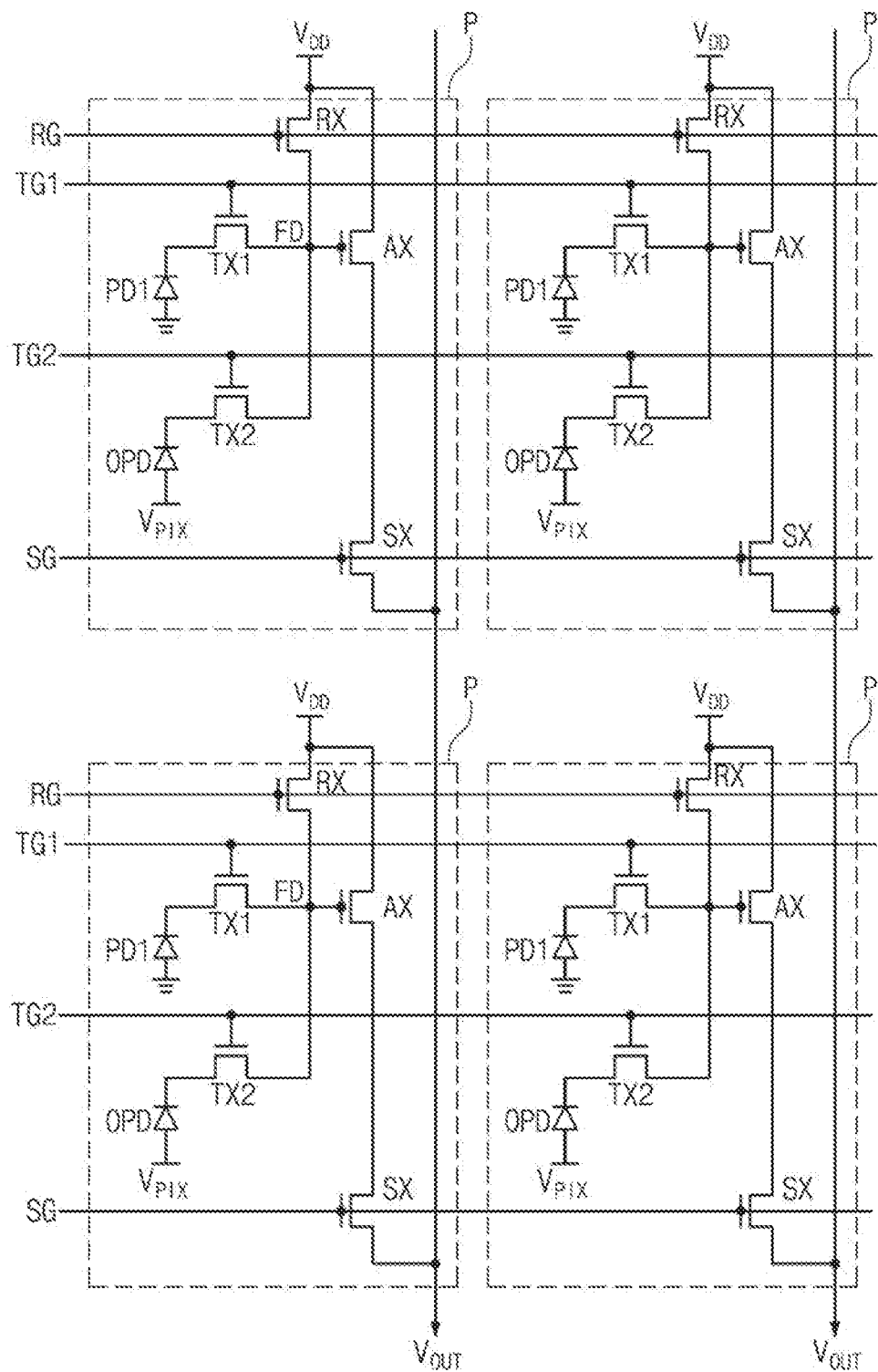
FIG. 13 illustrates a circuit diagram showing an active pixel sensor array of an image sensor according to some example embodiments.

FIG. 13 illustrates a circuit diagram showing an active pixel sensor array of an image sensor according to some example embodiments.

Referring to FIG. 13, each of unit pixels P may include a photoelectric conversion element PD, an organic photoelectric conversion element OPD, a first transfer transistor TX1 and a second transfer transistor TX2, and readout transistors RX, SX, and DX. The readout transistors may include a reset transistor RX, an amplifier transistor AX, and a selection transistor SX, as discussed with reference to FIG. 2A.

The first transfer transistor TX1 may be connected to the photoelectric conversion element PD, and the second transfer transistor TX2 may be connected to the organic photoelectric conversion element OPD. The first and second transfer transistors TX1 and TX2 may share a charge detection node FD (i.e., a floating diffusion region).

The photoelectric conversion element PD and the organic photoelectric conversion element OPD may create and accumulate photo-charges in proportion to an amount of externally incident light. In certain example embodiments, the photoelectric conversion element PD may be one of a photo diode, a photo transistor, a photo gate, a pinned photo diode (PPD), and a combination thereof. The organic photoelectric conversion element OPD may include an organic photoelectric conversion layer. The organic photoelectric conversion layer may create photo-charges (electron-hole pairs) in proportion to incident light having a certain wavelength band. A difference in voltage applied to opposite ends of the organic photoelectric conversion element OPD may allow the charge detection node FD to store the photo-charges generated from the organic photoelectric conversion layer.

The first and second transfer transistors TX1 and TX2 may transfer, to the charge detection node FD, the charges accumulated in the photoelectric conversion element PD and the organic photoelectric conversion element OPD. The first and second transfer transistors TX1 and TX2 may be controlled by charge transfer signals provided through first and second charge transfer lines TG1 and TG2, and in accordance with the charge transfer signals applied to the first and second transfer transistors TX1 and TX2, charges may be transferred to the charge detection node FD from any one of the photoelectric conversion element PD and the organic photoelectric conversion element OPD.

Figure 14:
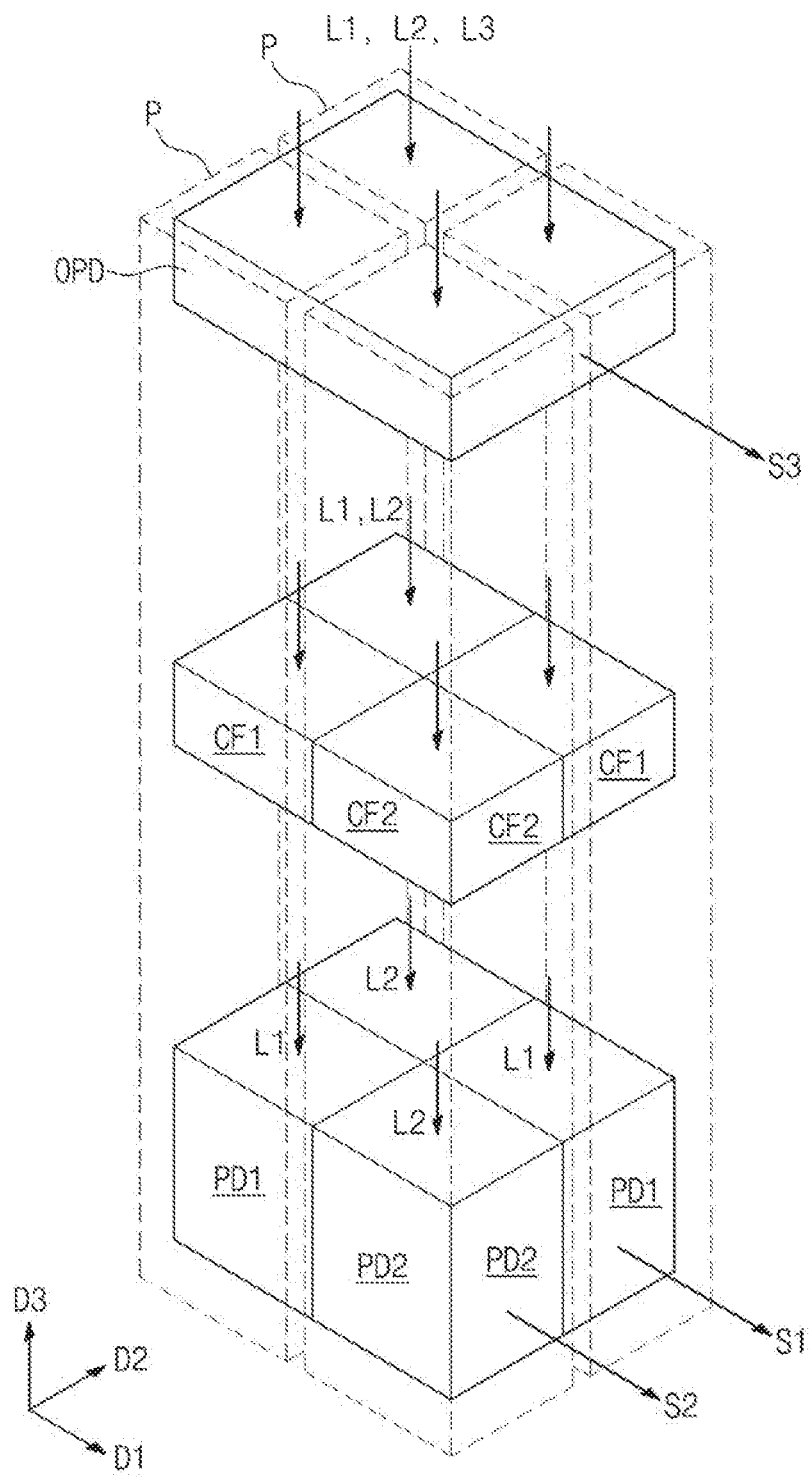
FIG. 14 illustrates a block diagram showing an image sensor according to some example embodiments.

FIG. 14 illustrates a block diagram showing an image sensor according to some example embodiments.

Referring to FIG. 14, an image sensor may include a plurality of unit pixels P that are two-dimensionally arranged along a first direction D1 and a second direction D2 intersecting the first direction D1. Each of the unit pixels P of the image sensor may have a structure in which at least two photoelectric conversion elements are stacked in a third direction D3 perpendicular to the first and second directions D1 and D2. Each of the unit pixels P may include one of first and second photoelectric conversion elements PD1 and PD2, one of first and second color filters CF1 and CF2, and an organic photoelectric conversion element OPD. For example a unit pixel P may include a first photoelectric conversion element PD1, a first color filter CF1, and an organic photoelectric conversion element OPD, and another unit pixel P may include a second photoelectric conversion element PD2, a second color filter CF2, and an organic photoelectric conversion element OPD, etc.

The first and second photoelectric conversion elements PD1 and PD2 may be provided in a semiconductor substrate and may be arranged in a matrix shape. The first and second photoelectric conversion elements PD1 and PD2 may be arranged in a zigzag fashion.

The organic photoelectric conversion elements OPD may be correspondingly stacked on the first and second photoelectric conversion elements PD1 and PD2, as illustrated in FIG. 14. For example, when viewed in plan, the organic photoelectric conversion element OPD may overlap a corresponding one of the first and second photoelectric conversion elements PD1 and PD2. The first color filters CF1 may be correspondingly provided between the first photoelectric conversion elements PD1 and the organic photoelectric conversion elements OPD, and the second color filters CF2 may be correspondingly provided between the second photoelectric conversion elements PD2 and the organic photoelectric conversion elements OPD.

In certain example embodiments, the organic photoelectric conversion region OPD of the unit pixel P may receive a corresponding one of a first incident light L1, a second incident light L2, and a third incident light L3 that respectively have a first wavelength band, a second wavelength band, and a third wavelength band. The first and second photoelectric conversion elements PD1 and PD2 and the organic photoelectric conversion element OPD may each receive incident light with a wavelength band different from that of any other incident light, and may each generate photo-charges in proportion to an amount of incident light.

For example, the first photoelectric conversion element PD1 may generate first photo-charges corresponding to the first incident light L1 with the first wavelength band. The second photoelectric conversion element PD2 may generate second photo-charges corresponding to the second incident light L2 with the second wavelength band. The organic photoelectric conversion element OPD may generate third photo-charges corresponding to the third incident light L3 with the third wavelength band. The first wavelength band may be longer than the third wavelength band, and the second wavelength band may be shorter than the third wavelength band. For example, the first incident light L1 with the first wavelength band may exhibit a red color, the second incident light L2 with the second wavelength band may exhibit a blue color, and the third incident light L3 with the third wavelength band may exhibit a green color.

The first incident light L1 with the first wavelength band may pass through the organic photoelectric conversion element OPD and the first color filter CF1 and then may enter the first photoelectric conversion element PD1, and the second incident light L2 with the second wavelength band may pass through the organic photoelectric conversion element OPD and the second color filter CF2 and then may enter the second photoelectric conversion element PD2. The third incident light L3 with the third wavelength band may enter the organic photoelectric conversion element OPD.

At the unit pixel P including the first photoelectric conversion element PD1, a first pixel signal S1 may be output which corresponds to the first incident light L1 with the first wavelength band, and at the unit pixel P including the second photoelectric conversion element PD2, a second pixel signal S2 may be output which corresponds to the second incident light L2 with the second wavelength band. In addition, the organic photoelectric conversion element OPD of the unit pixel P may output a third pixel signal S3 corresponding to the third incident light L3 with the third wavelength band. For example, the first photoelectric conversion element PD1 may generate photo-charges corresponding to a red light. The second photoelectric conversion element PD2 may generate photo-charges corresponding to a blue light. The organic photoelectric conversion element OPD may generate photo-charges corresponding to a green light.

Figure 15:
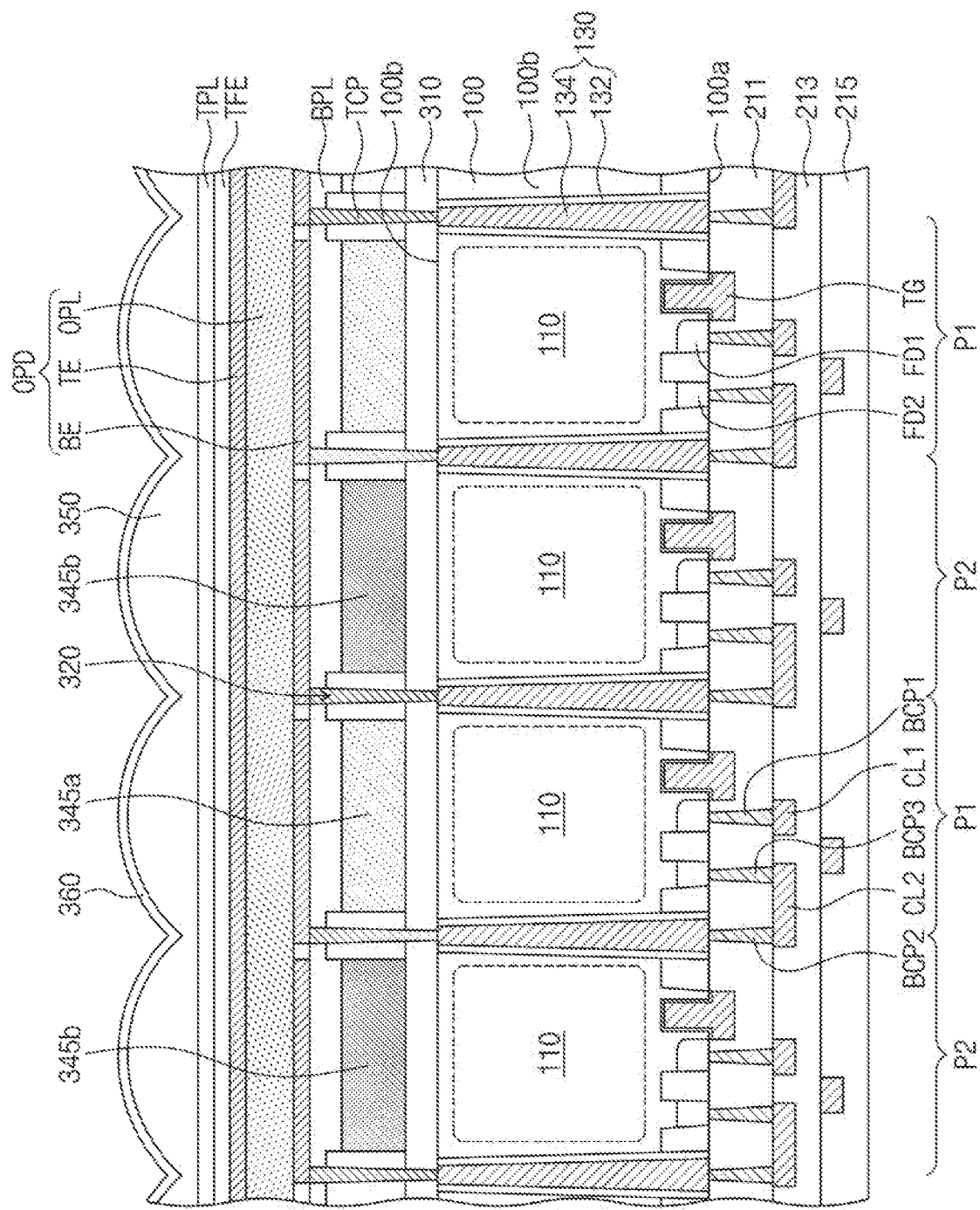
FIG. 15 illustrates a cross-sectional view showing an image sensor according to some example embodiments.

FIG. 15 illustrates a cross-sectional view showing an image sensor according to some example embodiments.

Referring to FIG. 15, as discussed above, the semiconductor substrate 100 may include therein the photoelectric conversion regions 110 and the pixel separation structure (see 103 of FIGS. 4A and 4B) that defines the pixel regions P1 and P2.

On each of the pixel regions P1 and P2, a transfer gate electrode TG may be disposed on the first surface 100a of the semiconductor substrate 100, and a first floating diffusion region FD1 may be provided in the semiconductor substrate 100 on one side of the transfer gate electrode TG. A second floating diffusion region FD2 may be provided in the semiconductor substrate 100 and spaced apart from the first floating diffusion region FD1.

The first and second floating diffusion regions FD1 and FD2 may be formed by implanting the semiconductor substrate 100 with impurities whose conductivity type is opposite to that of semiconductor substrate 100. For example, the first and second floating diffusion regions FD1 and FD2 may be n-type impurity regions.

The pixel regions P1 and P2 may have therebetween a through electrode structure 130 that penetrates a portion of the pixel separation structure 103.

The through electrode structure 130 may include a through electrode 134 that vertically penetrates the semiconductor substrate 100 and a through dielectric pattern 132 that surrounds a sidewall of the through electrode 134. The through electrode 134 may include a conductive material. The through electrode 134 may include either metal or polysilicon doped with n-type or p-type impurities. The through electrode 134 may have a width that gradually decreases from the first surface 100a to the second surface 100b of the semiconductor substrate 100. The through dielectric pattern 132 may include, for example, one or more of silicon oxide, silicon nitride, and silicon oxynitride.

Interlayer dielectric layers 211, 213, and 215 may be disposed on the first surface 100a of the semiconductor substrate 100, and may cover the transfer gate electrodes TG and MOS transistors that constitute first and second readout circuits. A plurality of bottom contact plugs BCP1 to BCP3 may be disposed in the interlayer dielectric layers 211, 213, and 215. For example, a first bottom contact plug BCP1 may be coupled to the first floating diffusion region FD1, and a second bottom contact plug BCP2 may be coupled to the second floating diffusion region FD2. A third bottom contact plug BCP3 may be coupled to the through electrode 134.

The first bottom contact plug BCP1 may be electrically connected through a first connection line CL1 to a reset transistor (see RX of FIG. 13) and an amplifier transistor (see AX of FIG. 13). The second bottom contact plug BCP2 may be connected through a second connection line CL2 to the third bottom contact plug BCP3. For example, the through electrode 134 may be electrically connected to the second floating diffusion region FD2 through the second bottom contact plug BCP2, the third bottom contact plug BCP3, and the second connection line CL2.

The planar dielectric layer 310 may be disposed on the second surface 100b of the semiconductor substrate 100. The planar dielectric layer 310 may include, as discussed above, a single layer or multiple layers. The planar dielectric layer 310 may include metal oxide, such as aluminum oxide and/or hafnium oxide.

The color filters 345a and 345b may be disposed on the planar dielectric layer 310 at each of the corresponding pixel regions P1 and P2. The color filters 345a and 345b may include the first color filters 345a on the first pixel regions P1 and the second color filters 345b on the second pixel regions P2.

The color filters 345a and 345b may be disposed in the openings defined by the grid structure 320 disposed on the planar dielectric layer 310. The first color filters 345a may be disposed on the first pixel regions P1, and the second color filters 345b may be disposed on the second pixel regions P2. As discussed above, in some example embodiments, each of the color filters 345a and 345b may have a substantially flat top surface parallel to a bottom surface thereof. The top surfaces of the color filters 345a and 345b may be located at a level lower than or substantially the same as that of a top surface of the grid structure 320.

A first upper planar layer BPL may cover the top surfaces of the color filters 345a and 345b. The first upper planar layer BPL is formed on the flat top surfaces of the color filters 345a and 345b, and may have a substantially flat top surface.

Top contact plugs TCP may penetrate the first upper planar layer BPL, a portion of the grid structure 320, and the planar dielectric layer 310, thereby being coupled to corresponding through electrodes 134. Each of the top contact plugs TCP may include a barrier metal layer formed of metal nitride, such as titanium nitride, tantalum nitride, or tungsten nitride, and also include a metal layer formed of metal, such as tungsten or copper.

An organic photoelectric conversion element OPD may be provided on the first upper planar layer BPL disposed on the second surface 100b of the semiconductor substrate 100. The organic photoelectric conversion element OPD may include bottom electrodes BE, a top electrode TE, and an organic photoelectric conversion layer OPL between the bottom and top electrodes BE and TE.

The bottom electrodes BE may be disposed on the first upper planar layer BPL having the flat top surface. When viewed in plan, the bottom electrodes BE may be disposed to correspond to the pixel regions P1 and P2, and may be spaced apart from each other. Each of the bottom electrodes BE may be electrically connected to the second floating diffusion region FD2 through a respective top contact plug TCP, the through electrode 134, the second and third bottom contact plugs BCP2 and BCP3, and the second connection line CL2.

The bottom electrodes BE may include a transparent conductive material. For example, the bottom electrodes BE may include one or more of ITO (indium tin oxide), IZO (indium zinc oxide), ZnO (zinc oxide), SnO2, ATO (antimony-doped tin oxide), AZO (aluminum-doped zinc oxide), GZO (gallium-doped zinc oxide), TiO2, and FTO (fluorine-doped tin oxide).

The organic photoelectric conversion layer OPL may be disposed on the bottom electrodes BE. The organic photoelectric conversion layer OPL may selectively absorb light with a specific wavelength band, and may thus cause photoelectric conversion. The organic photoelectric conversion layer OPL may include a p-type organic semiconductor material and an n-type organic semiconductor material, which p-type and n-type semiconductor materials form a p-n junction. In other embodiments, the organic photoelectric conversion layer OPL may include quantum dots or chalcogenide.

The top electrode TE may be provided on the organic photoelectric conversion layer OPL. The top electrode TE may include a transparent conductive material, and may entirely cover the pixel regions P1 and P2.

An encapsulation layer TFE may be disposed on the top electrode TE. The encapsulation layer TFE may be formed of a single layer or multiple layers. The encapsulation layer TFE may include, for example, an aluminum layer and a silicon oxynitride layer. A second upper planar layer TPL may be disposed on the encapsulation layer TFE, and the micro-lens array 350 may be disposed on the second upper planar layer TPL. The second upper planar layer TPL may include a transparent dielectric material, for example, metal oxide or silicon oxide. The micro-lens array 350 may include micro-lenses that correspond to the pixel regions P1 and P2.

FIGS. 16A to 16H illustrate cross-sectional views taken along line I-I' of FIG. 4A, showing a method of fabricating an image sensor according to some example embodiments.

Referring to FIGS. 4A and 16A, a semiconductor substrate 100 may be provided which has a first conductivity type (e.g., p-type). The semiconductor substrate 100 may have a first surface 100a and a second surface 100b opposite to each other.

In certain example embodiments, the semiconductor substrate 100 may include first, second, and third pixel regions (see P1, P2, and P3 of FIG. 3), each of which pixel regions P1, P2, and P3 may include a plurality of sub-pixel regions (see PG1/PG2, PR, and PB of FIG. 3).

Photoelectric conversion regions 110 may be formed in the semiconductor substrate 100. On each of the sub-pixel regions PG1/PG2, PR, and PB, the photoelectric conversion region 110 may be formed by implanting the semiconductor substrate 100 with impurities having a second conductivity type (e.g., n-type) different from the first conductivity type.

A device isolation layer 101 may be formed to lie adjacent to the first surface 100a on each of the sub-pixel regions PG1/PG2, PR, and PB and to define active regions on the semiconductor substrate 100. The device isolation layer 101 may be formed by forming a shallow trench by patterning the first surface 100a of the semiconductor substrate 100 and then depositing a dielectric material in the shallow trench. The formation of the device isolation layer 101 may be preceded by or followed by the formation of the photoelectric conversion regions 110.

A pixel separation structure 103 may be formed on the semiconductor substrate 100, defining the sub-pixel regions PG1/PG2, PR, and PB. The pixel separation structure 103 may be formed by forming a deep trench by patterning the first surface 100a and/or the second surface 100b of the semiconductor substrate 100, and then filling the deep trench with a dielectric material.

Figure 16B:
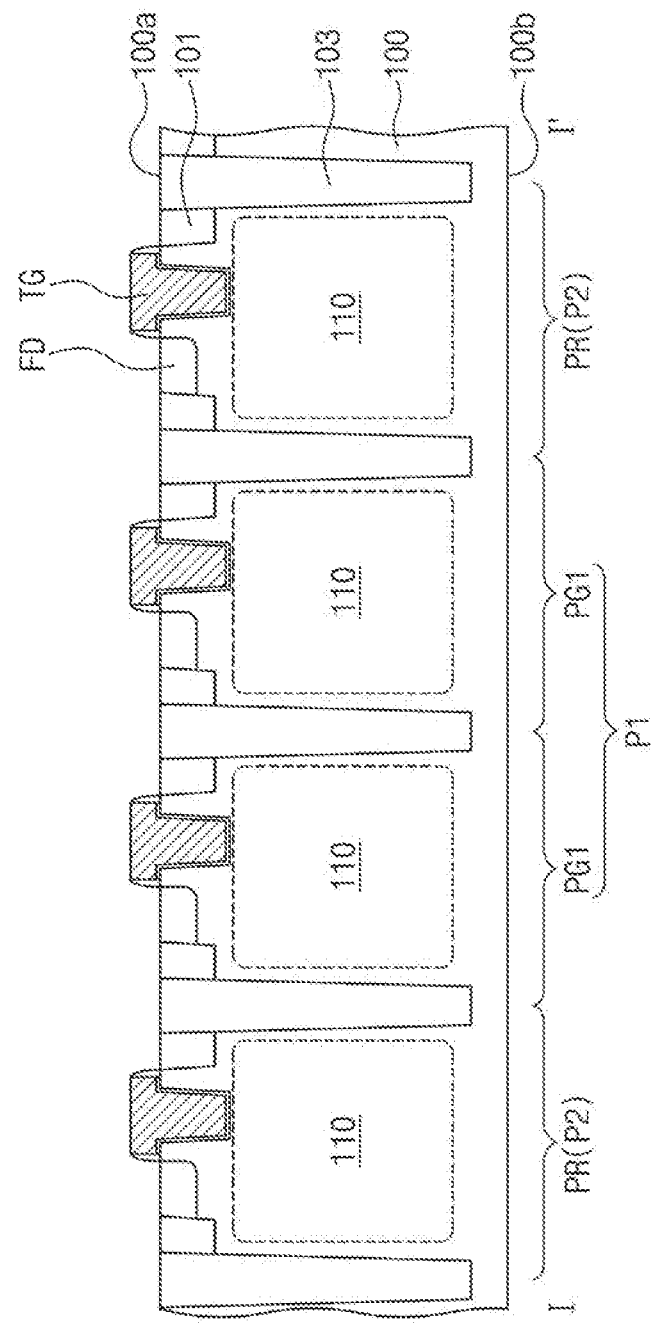
FIGS. 16A to 16H illustrate cross-sectional views taken along line I-I' of FIG. 4A, showing a method of fabricating an image sensor according to some example embodiments.

Referring to FIGS. 4A and 16B, metal oxide semiconductor (MOS) transistors may be formed to constitute readout circuits on the first surface 100a of the semiconductor substrate 100. For example, transfer gate electrodes TG may be formed on the first surface 100a of the semiconductor substrate 100 with a gate dielectric layer interposed between the semiconductor substrate 100 and each of the transfer gate electrodes TG. Gate electrodes (not shown) of readout transistors may also be formed together with the transfer gate electrodes TG.

After the formation of the transfer gate electrodes TG, floating diffusion regions FD may be formed in the semiconductor substrate 100 on one sides of the transfer gate electrodes TG. The floating diffusion regions FD may be formed by implanting impurities having the second conductivity type. In addition, source/drain impurity regions (not shown) of readout transistors may also be formed together with floating diffusion regions FD.

Figure 16C:
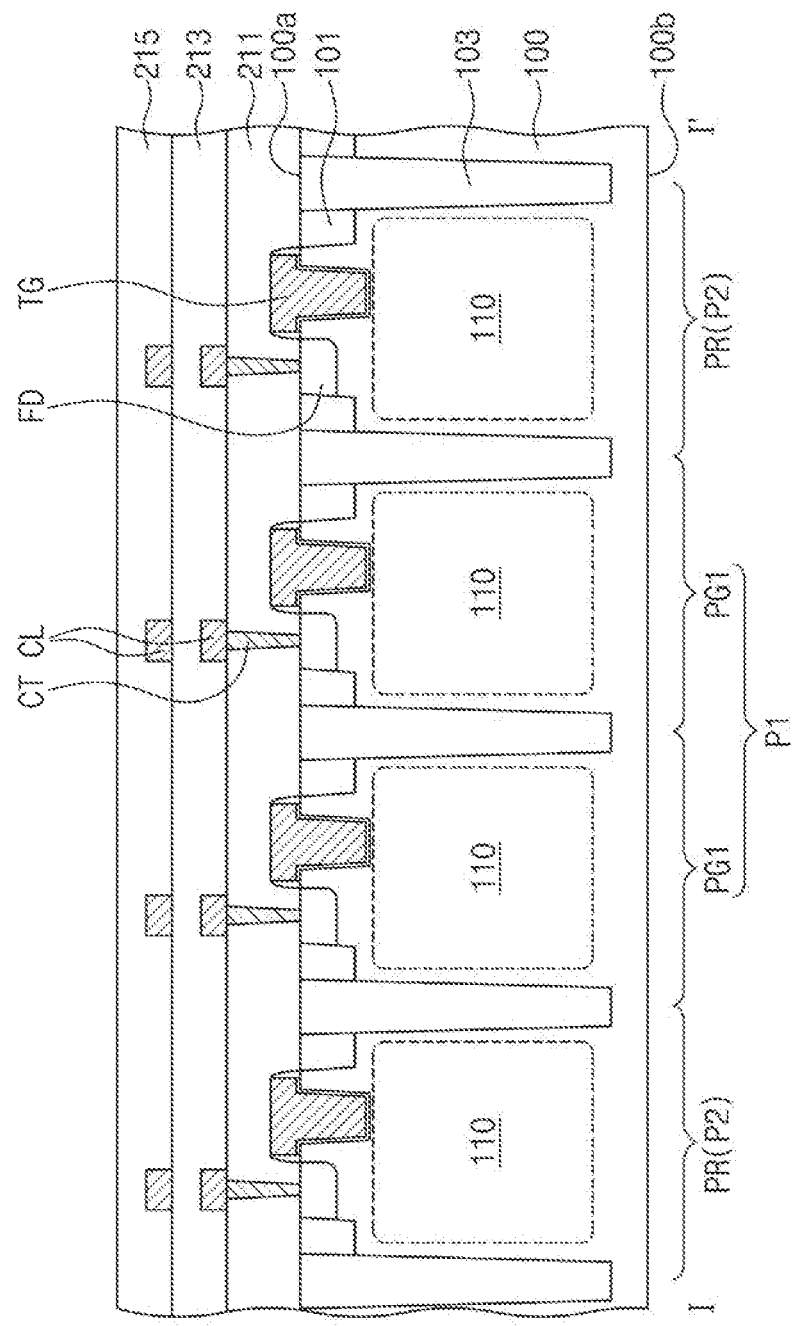

Referring to FIGS. 4A and 16C, interlayer dielectric layers 211, 213, and 215, contact plugs CT, and connection lines CL may be formed on the first surface 100a of the semiconductor substrate 100. The interlayer dielectric layers 211, 213, and 215 may cover first and second transfer transistors and logic transistors. The interlayer dielectric layers 211, 213, and 215 may be formed of a material having superior gap-fill characteristics, and may have their planarized upper portions.

The contact plugs CT may be formed in the interlayer dielectric layers 211, 213, and 215, thereby being connected to the floating diffusion regions FD or readout transistors. The connection lines CL may be formed between the interlayer dielectric layers 211, 213, and 215. The contact plugs CT and the connection lines CL may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or an alloy thereof.

Figure 16D:
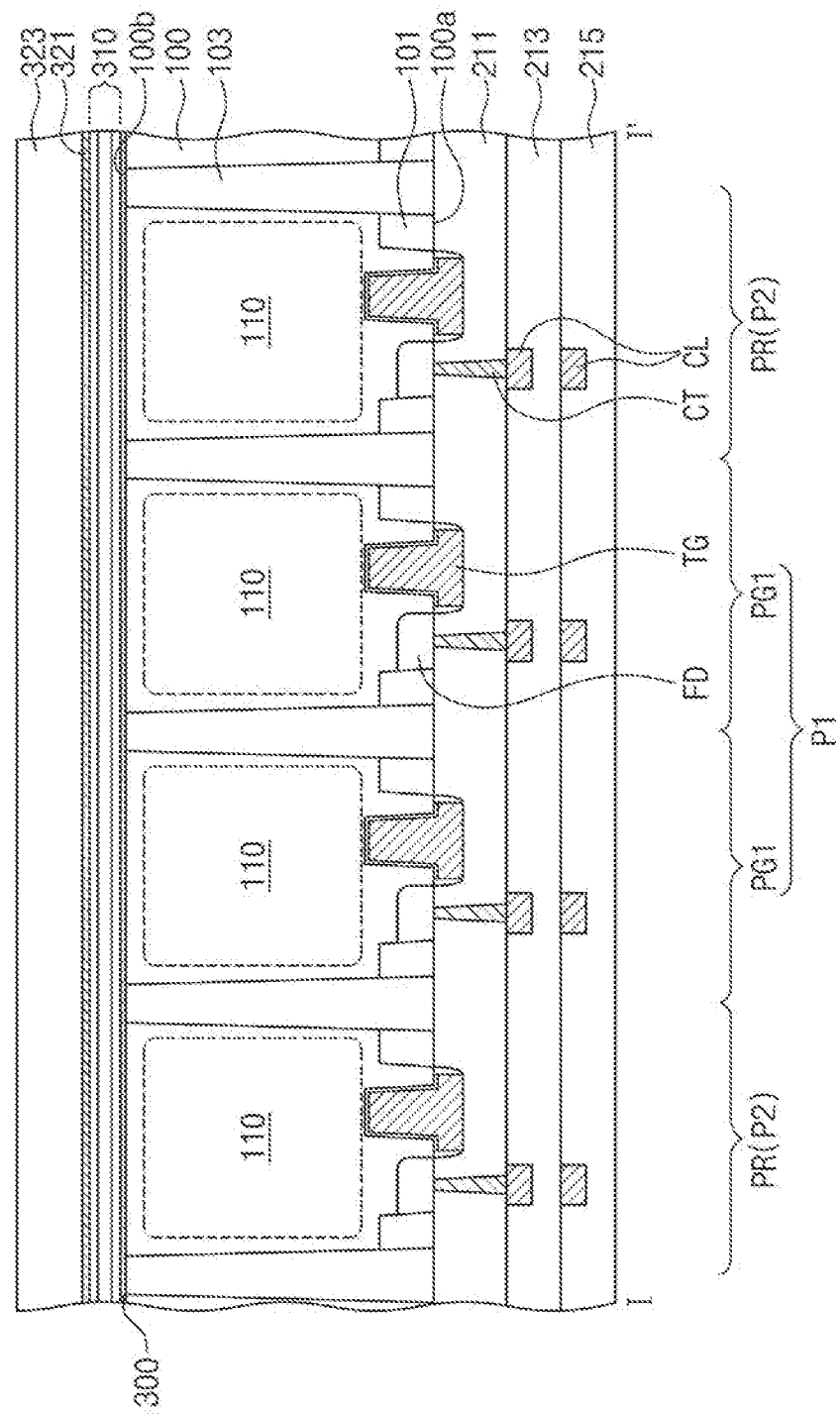

Referring to FIGS. 4A and 16D, a thinning process may be performed to remove a portion of the semiconductor substrate 100, and therefore the semiconductor substrate 100 may have a reduced vertical thickness. The semiconductor substrate 100 may be turned upside down to perform the thinning process thereon. A grinding or polishing process may be executed to remove a portion of the semiconductor substrate 100, and thereafter an anisotropic or isotropic etching process may be perform to remove remaining surface defects from the semiconductor substrate 100. The thinning process on the semiconductor substrate 100 may expose the pixel separation structure 103 from the second surface 100b of the semiconductor substrate 100. For example, the pixel separation structure 103 may have a surface at substantially the same level as that of the second surface 100b of the semiconductor substrate 100.

Afterwards, a fixed charge layer 300 may be formed on the second surface 100b of the semiconductor substrate 100. The fixed charge layer 300 may directly cover the second surface 100b of the semiconductor substrate 100. The fixed charge layer 300 may be formed of metal oxide, such as aluminum oxide and/or hafnium oxide.

A planar dielectric layer 310 may be formed on the fixed charge layer 300. The formation of the planar dielectric layer 310 may include sequentially depositing a first planar layer 311, a second planar layer 313, and a third planar layer 315. The first, second, and third planar layers 311, 313, and 315 may be formed of a transparent dielectric material, and may have different thicknesses from each other. The first, second, and third planar layers 311, 313, and 315 may include, for example, metal oxide or silicon oxide.

A light-shield layer 321 and a low-refractive layer 323 may be sequentially formed on the planar dielectric layer 310. The light-shield layer 321 may be formed of a metallic material, such as titanium, tungsten, or aluminum. The low-refractive layer 323, as discussed above, may be formed of a material whose refractive index ranges from about 1.1 to about 1.3. The low-refractive layer 323 may include an organic material and oxide. The refractive index of the low-refractive layer 323 may depend on concentration of oxide contained in the low-refractive layer 323. The formation of the low-refractive layer 323 may include spin-coating a composition including an organic material and a solvent on the light-shield layer 321, and performing a soft bake process or a dry process to remove the solvent.

Figure 16E:
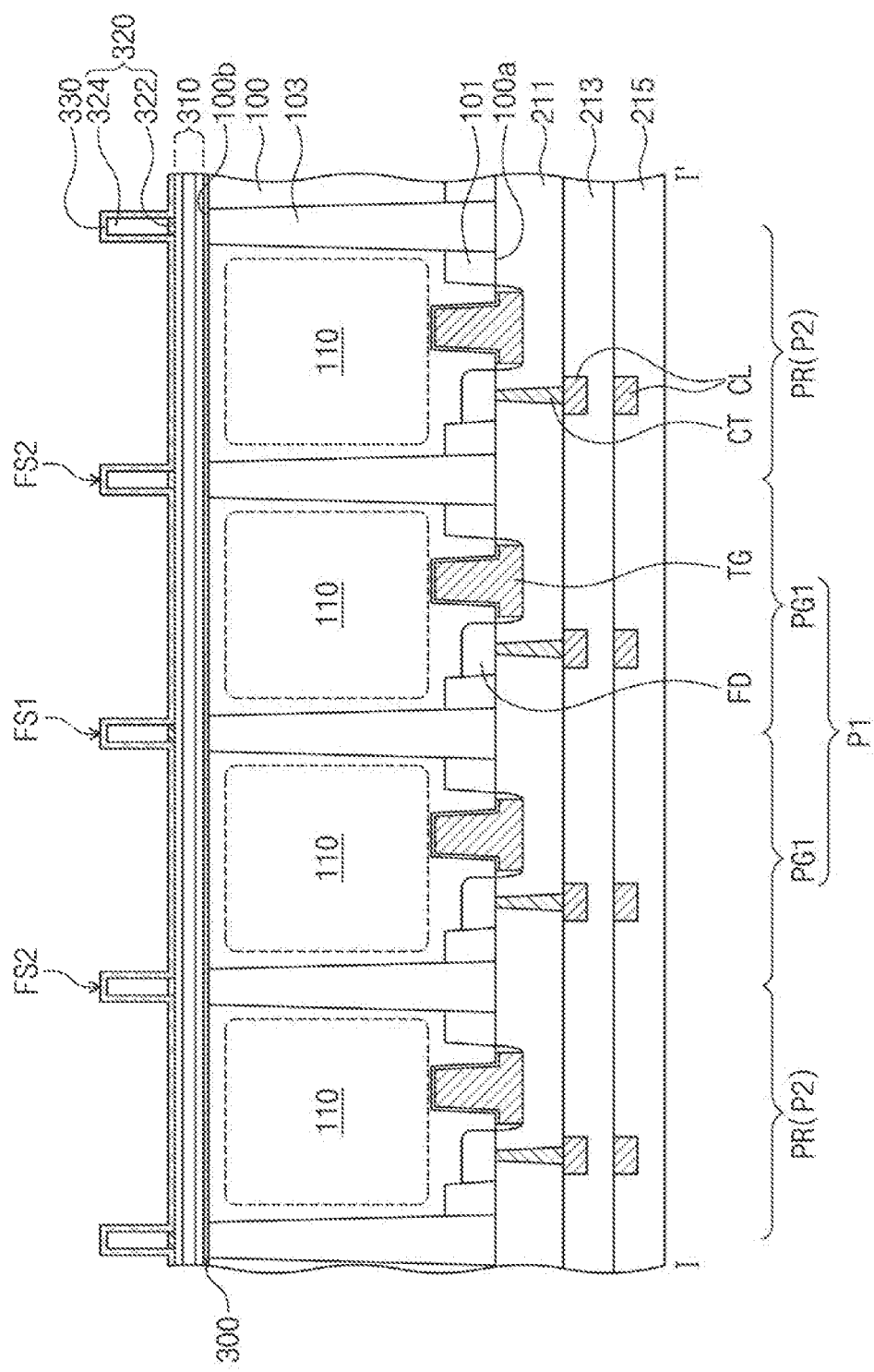

Referring to FIGS. 4A and 16E, the low-refractive layer 323 and the light-shield layer 321 may be patterned to form a grid structure 320 including a lower-refractive pattern 324 and a light-shield pattern 322. When viewed in plan, as discussed above, the grid structure 320 may overlap the pixel separation structure 103 in the semiconductor substrate 100.

The formation of the grid structure 320 may include forming a mask pattern (not shown) on the low-refractive layer 323, using the mask pattern as an etching mask through which the low-refractive layer 323 and the light-shield layer 321 are sequentially etched to expose the planar dielectric layer 310. After the formation of the grid structure 320, the mask pattern may be removed.

The grid structure 320 may include first fence segments FS1 provided between neighboring sub-pixel regions PG1/PG2, PR, and PB and second fence segments FS2 provided between neighboring pixel regions P1, P2, and P3. The first and second fence segments FS2 may have substantially the same height. In addition, the first and second fence segments FS2 may have substantially the same width.

After that, a protective layer 330 may be formed to conformally cover a surface of the grid structure 320 and a top surface of the planar dielectric layer 310 exposed by the grid structure 320. The protective layer 330 may be formed by performing a chemical vapor deposition process or an atomic layer deposition process. The protective layer 330 may be formed of a single layer or multiple layers including one or more of an aluminum oxide layer and a silicon carbide oxide layer.

Figure 16F:
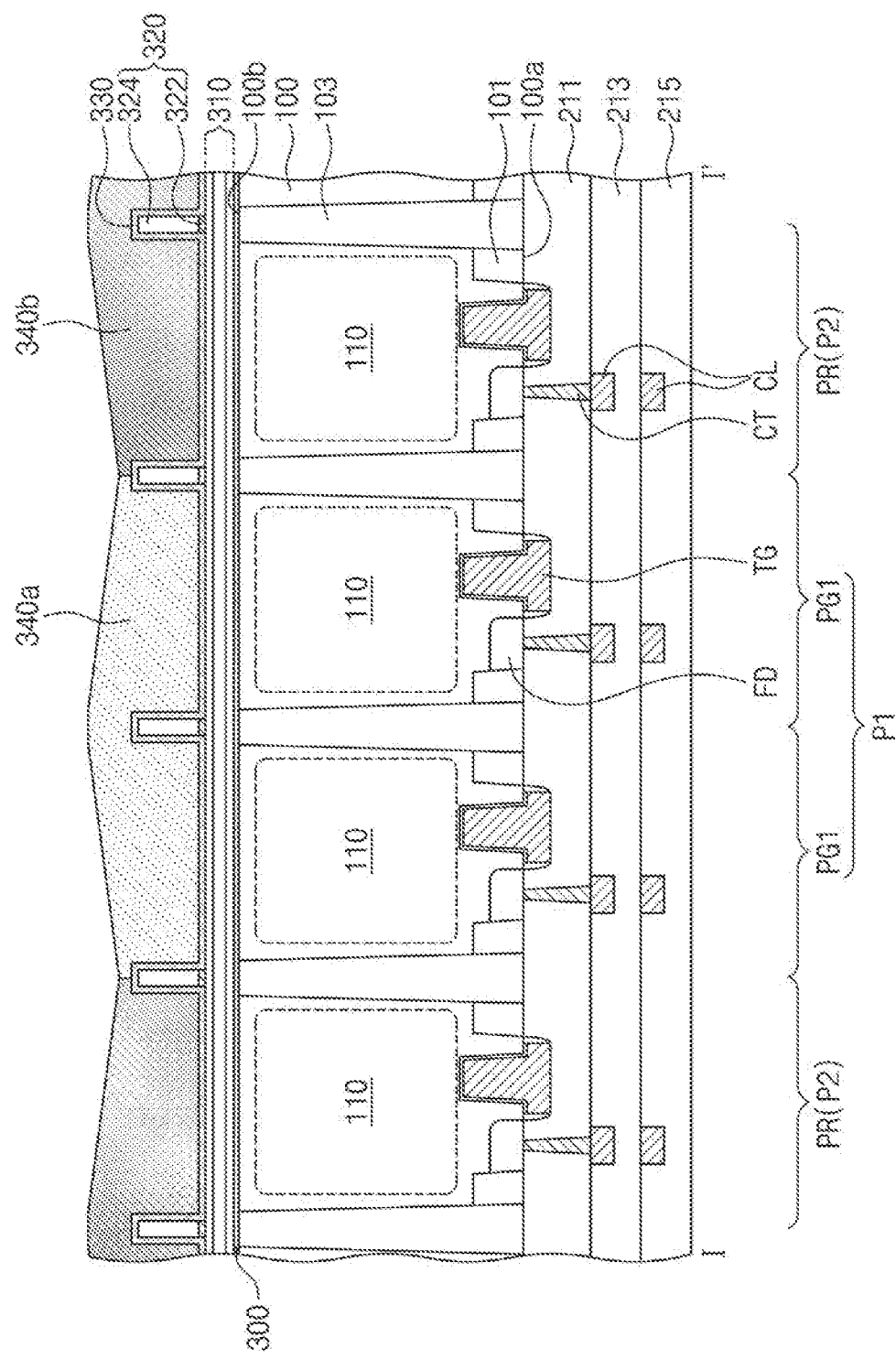

Referring to FIGS. 4A and 16F, preliminary color filters 340*a* and 340*b* may be sequentially formed on corresponding pixel regions (see P1, P2, and P3 of FIG. 3). For example, a first preliminary color filter 340*a* may be formed on the first pixel region P1, and a second preliminary color filter 340*b* may be formed on the second pixel region P2. In addition, a third preliminary color filter (not show) may be formed on the third pixel region P3.

Each of the preliminary color filters 340*a* and 340*b* may be formed by a spin coating process and a patterning process that are performed several times. The preliminary color filters 340*a* and 340*b* may fill empty spaces defined by the grid structure 320. For example, the preliminary color filters 340*a* and 340*b* may be formed by a coating process, a soft bake process, an exposure process, and a development process that are sequentially performed on a photoresist composition including a dye or pigment.

In certain example embodiments, each of the preliminary color filters 340*a* and 340*b* may be provided in common to the sub-pixel regions PG1/PG2, PR, and PB of the pixel regions P1, P2, and P3. For example, when each of the preliminary color filters 340*a* and 340*b* is formed, a coating process may be performed such that each of the preliminary color filters 340*a* and 340*b* may cover the first fence segment FS1 of the grid structure 320. Each of the preliminary color filters 340*a* and 340*b* may have a relatively larger thickness at a portion adjacent to the first fence segment FS1 and a relatively smaller thickness at a portion adjacent to the second fence segment FS2. As such, each of the preliminary color filters 340*a* and 340*b* may have an upwardly convex top surface. In addition, the preliminary color filters 340*a* and 340*b* may be formed independently of each other, such that the preliminary color filters 340*a* and 340*b* may have different thicknesses from each other.

Figure 16G:
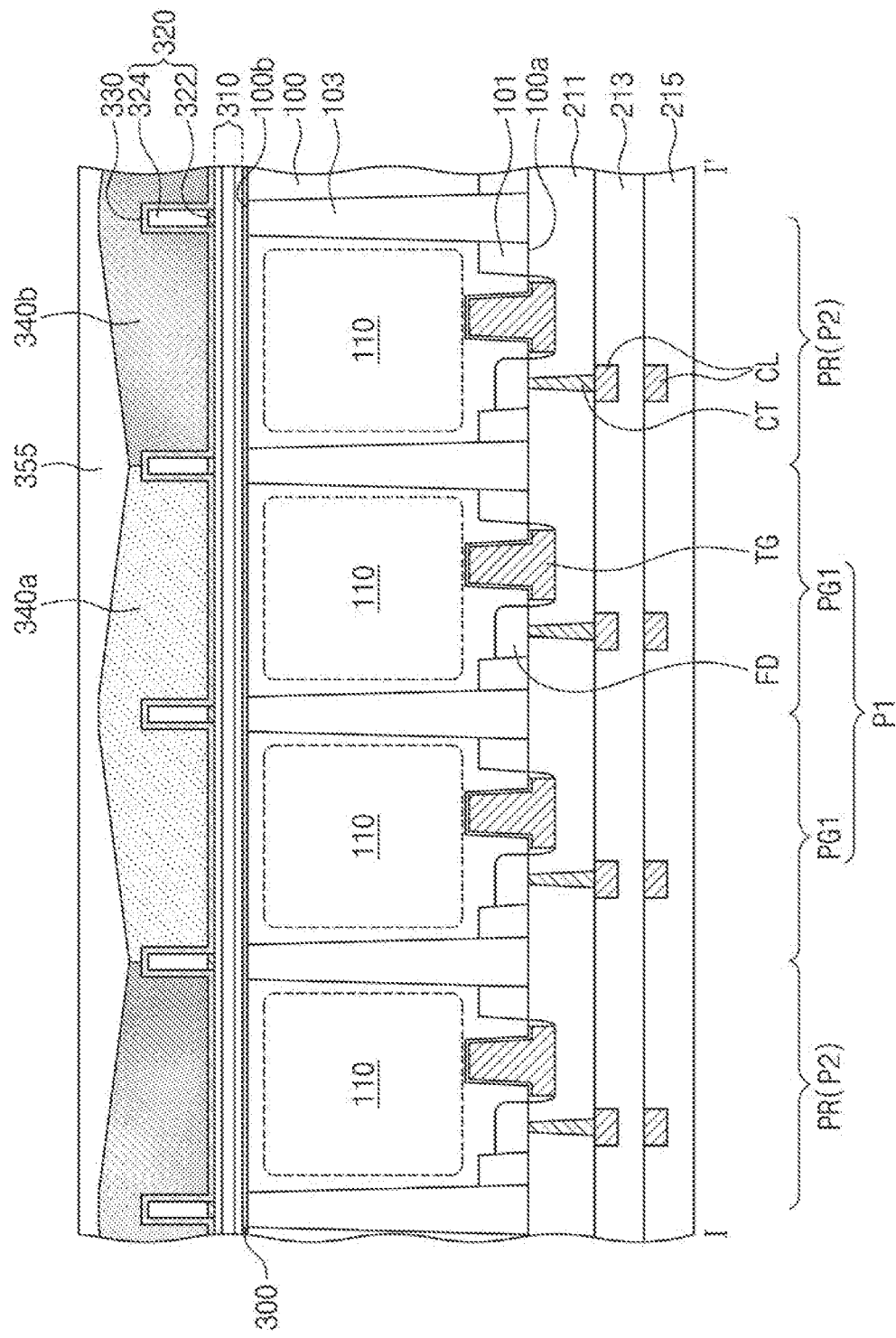
Figure 16I:
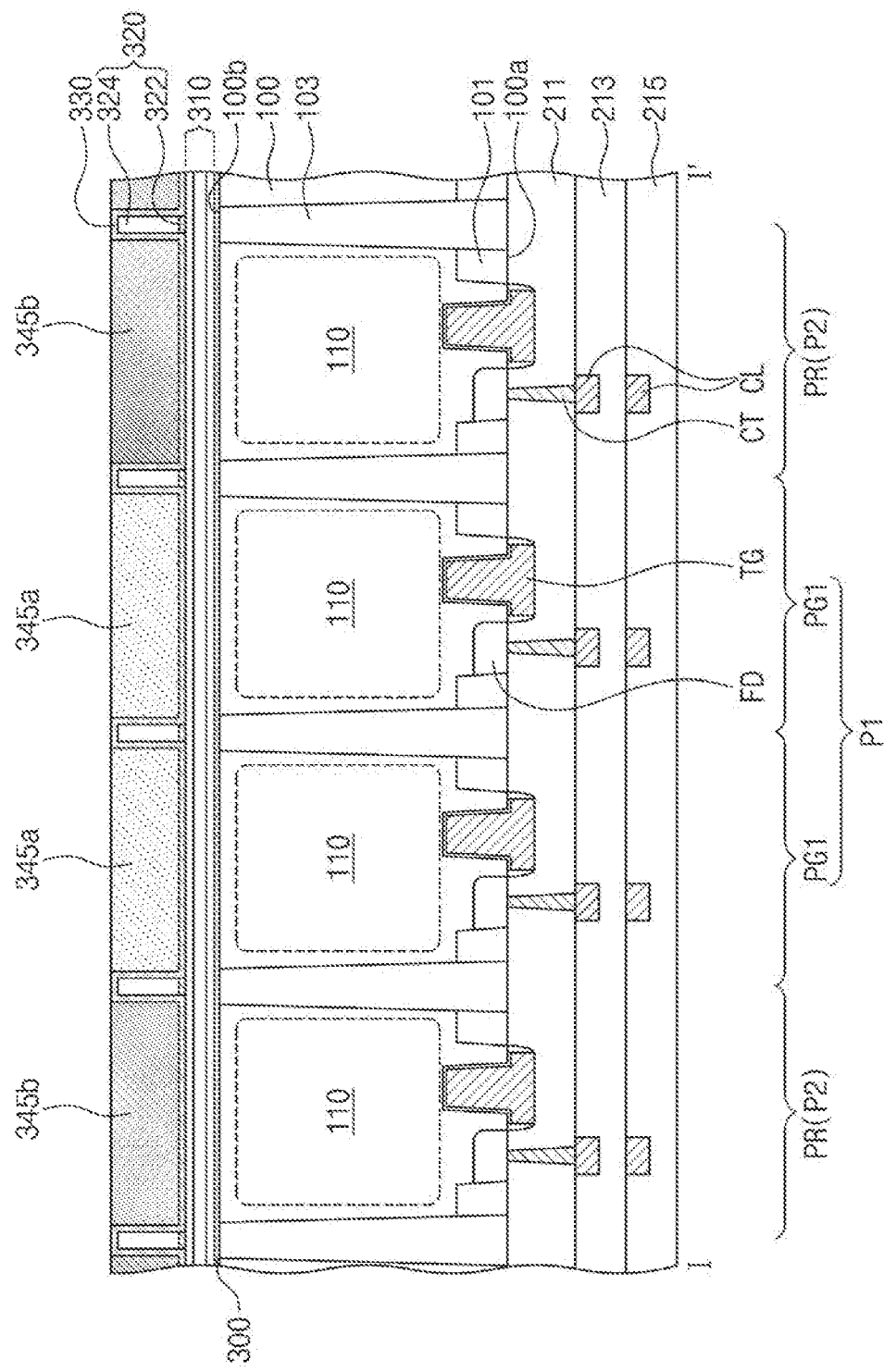

Referring to FIGS. 4A and 16G, a sacrificial planar layer 355 may be formed to cover the top surfaces of the preliminary color filters 340*a* and 340*b*. The sacrificial planar layer 355 may be formed of a material having an etch selectivity of about 1:1 with respect to the preliminary color filters 340*a* and 340*b* in an etching process that uses the same etch recipe for the preliminary color filters 340*a* and 340*b*. The sacrificial planar layer 355 may be formed of a transparent dielectric material. The sacrificial planar layer 355 may be formed of, for example, SOG (spin on glass), FSG (fluoride silicate glass), FOX (flowable oxide), or TOSZ (tonen silazene). The sacrificial planar layer 355 may be formed by spin-coating a flowable material. The sacrificial planar layer 355 may cover the uneven top surfaces of the preliminary color filters 340*a* and 340*b*, but may have a substantially flat top surface. For example, the sacrificial planar layer 355 may have different thicknesses on the first and second fence segments FS1 and FS2. That is, for example, the sacrificial planar layer 355 may have a thickness on the second fence segment FS2 that is greater than a thickness on the first fence segment FS1, as illustrated in FIG. 16G.

Referring to FIGS. 4A and 16H, after the formation of the sacrificial planar layer 355, a planarization process may be performed on the sacrificial planar layer 355 and the preliminary color filters 340*a* and 340*b*. Therefore, first color filters 345*a*, second color filters 345*b*, and third color filters (not shown) may be formed to correspond to the first pixel regions P1, the second pixel regions P2, and the third pixel regions P3. For example, the planarization process may include an etch-back process or a chemical mechanical polishing process.

When the planarization process is performed, the protective layer 330 covering the top surface of the grid structure 320 may be used as an etch stop layer or a planarization stop layer. For example, the planarization process may continue until the protective layer 330 which covers the top surface of the grid structure 320 is exposed. After the planarization process, the first fence segment FS1 of the grid structure 320 may separate the first preliminary color filter 340*a* into four first color filters 345*a*. This separation may be identically applicable to the second preliminary color filter 340*b*.

When the planarization process is performed, the sacrificial planar layer 355 may be etched with an etch selectivity of about 1:1 with respect to the preliminary color filters 340*a* and 340*b*. Accordingly, each of the first color filter 345*a*, the second color filter 345*b*, and the third color filter may have substantially the same thickness on the first and second fence segments FS2. For example, each of the first color filter 345*a*, the second color filter 345*b*, and the third color filter may have a substantially flat top surface. In addition, after the planarization process, the top surfaces of the first color filter 345*a*, the second color filter 345*b*, and the third color filter may be located at a level lower than or substantially the same as that of the top surface of the grid structure 320.

Thereafter, as illustrated in FIGS. 4A and 4B, a micro-lens array 350 may be formed to include micro-lenses 353 that correspond to the sub-pixel regions PG1/PG2, PR, and PB.

The micro-lens array 350 may be formed by forming a light-transmissive photoresist layer, partially patterning the photoresist layer to form photoresist patterns that correspond to the sub-pixel regions PG1/PG2, PR, and PB, and reflowing the photoresist patterns. Thus, the micro-lenses 353 may be formed to have their upward convex shape having a constant curvature. Further, a planar segment 351 may be formed to have a uniform thickness between the micro-lenses 353 and the first color filter 345a, the second color filter 345b, and the third color filter.

Because the micro-lens array 350 is formed by coating the light-transmissive photoresist layer on the first color filter 345a, the second color filter 345b, and the third color filter that have the flat top surfaces, the micro-lens array 350 may have a substantially uniform thickness at the maximum thickness of the micro-lens array. The micro-lenses 353 may have a substantially constant curvature on the top surfaces of the color filters 345a and 345b. In this case, the micro-lens array 350 may improve in thickness distribution.

After that, a passivation layer 360 may be formed to conformally cover surfaces of the micro-lenses 353. The passivation layer 360 may be formed of, for example, inorganic oxide.

FIGS. 17A to 17D illustrate cross-sectional views taken along line I-I' of FIG. 4A, showing a method of fabricating an image sensor according to some example embodiments.

Figure 17A:
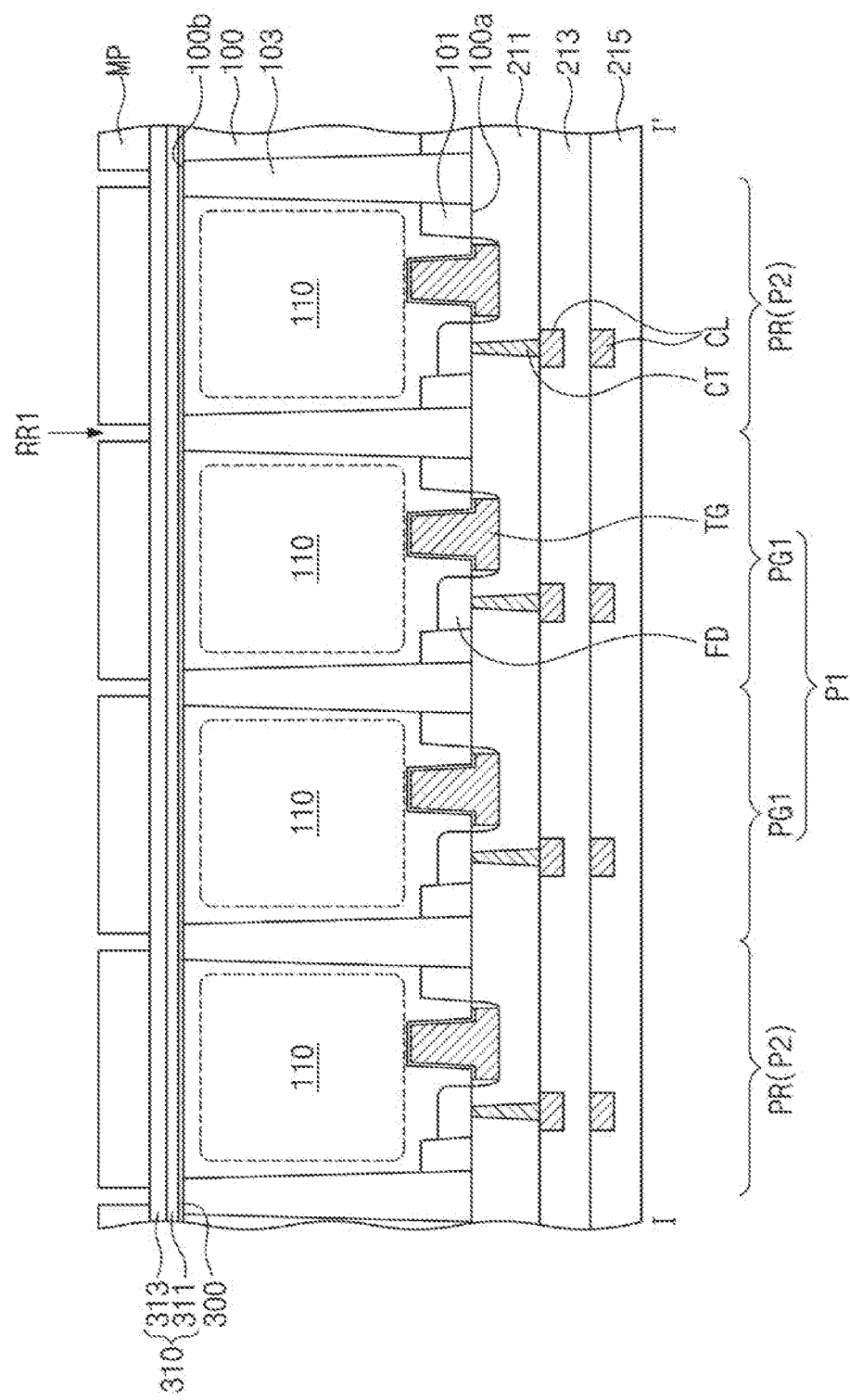
FIGS. 17A to 17D illustrate cross-sectional views taken along line I-I' of FIG. 4A, showing a method of fabricating an image sensor according to some example embodiments.

Referring to FIG. 17A, after the planarization process on the second surface 100b of the semiconductor substrate 100 as discussed above in FIG. 16D, a fixed charge layer 300 may be formed on the second surface 100b. A planar dielectric layer 310 may be formed on the fixed charge layer 300. In this case, the formation of the planar dielectric layer 310 may include sequentially depositing first and second planar layers 311 and 313. The first and second planar layers 311 and 313 may be formed of a transparent dielectric material, and may have different thicknesses and different refractive indices. The first planar layer 311 may include a hafnium oxide layer, a tantalum oxide layer, or a titanium oxide layer. The second planar layer 313 may include a silicon oxide layer, such as TEOS.

Afterwards, sacrificial patterns MP may be formed on the planar dielectric layer 310. The sacrificial patterns MP may have a thickness greater than that of the planar dielectric layer 310. The formation of the sacrificial patterns MP may include coating a sacrificial layer on the planar dielectric layer 310, forming photoresist patterns on the sacrificial layer, and using the photoresist patterns as an etching mask to etch the sacrificial layer. The sacrificial patterns MP may define a grid-shaped preliminary recession RR1 on the planar dielectric layer 310. The preliminary recession RR1 may expose the planar dielectric layer 310. The sacrificial patterns MP may contain carbon whose content is equal to or greater than about 70 wt %. For example, the sacrificial patterns MP may include a spin-on-hardmask (SOH) layer.

Figure 17B:
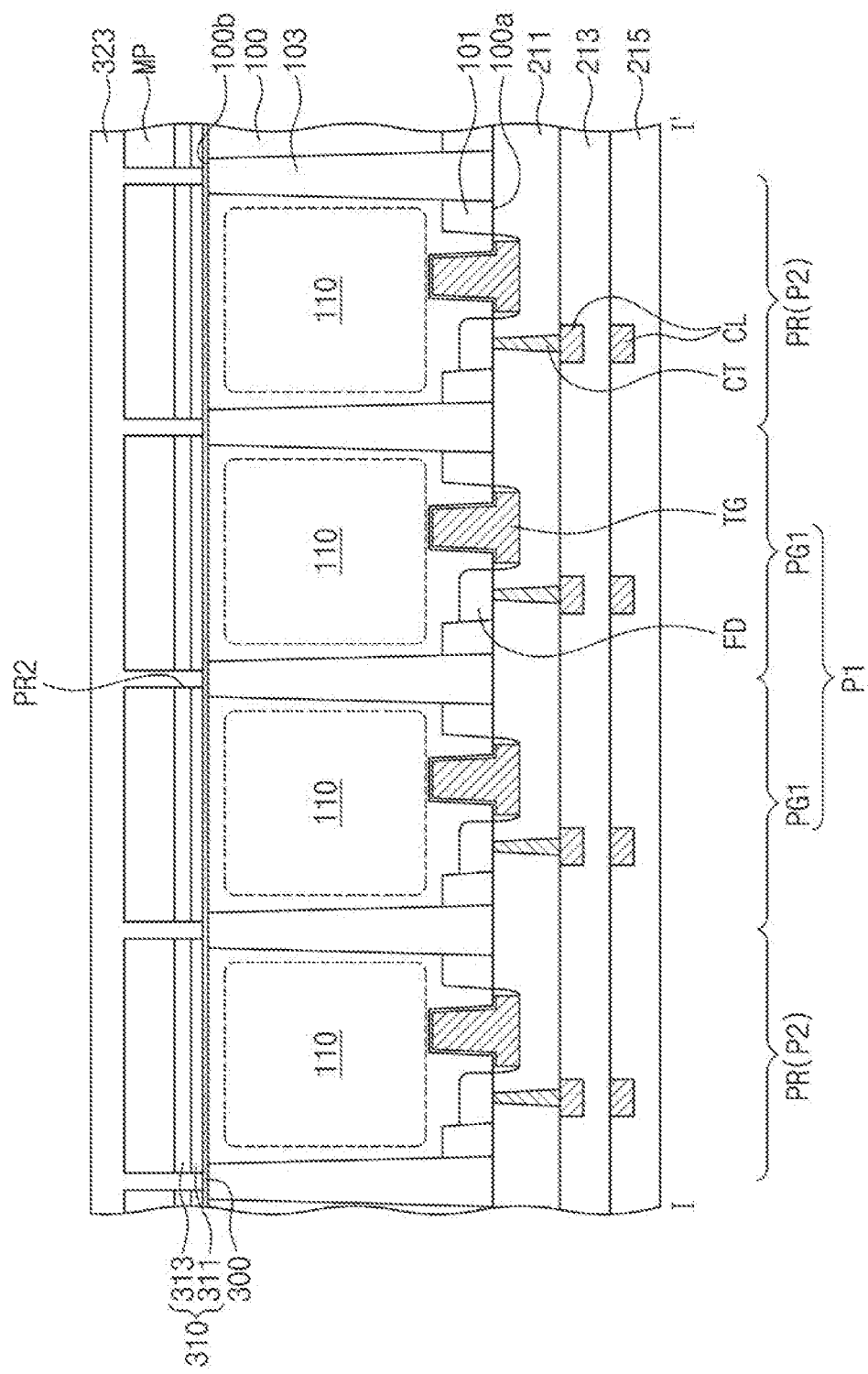

Referring to FIG. 17B, the sacrificial patterns MP may be used as an etching mask to pattern the planar dielectric layer 310. Accordingly, the planar dielectric layer 310 may have therein a recession RR2 that is formed to expose the fixed charge layer 300. Alternatively, in some example embodiments, the fixed charge layer 300 may be etched when the recession RR2 is formed, and thus the recession RR2 may expose the pixel separation structure 103.

After the formation of the recession RR2, a low-refractive layer 323 may be formed to fill the recession RR2. The low-refractive layer 323 may be formed by performing a spin coating process. Therefore, the low-refractive layer 323 may completely fill the recession RR2 and may cover top surfaces of the sacrificial patterns MP.

Thereafter, a planarization process may be performed with respect to the low-refractive layer 323 until the top surfaces of the sacrificial patterns MP are exposed.

The sacrificial patterns MP may be selectively removed to expose a top surface of the planar dielectric layer 310 on each of the sub-pixel regions PG1/PG2, PR, and PB. For example, the sacrificial patterns MP may be removed by an ashing process that uses oxygen.

Figure 17C:
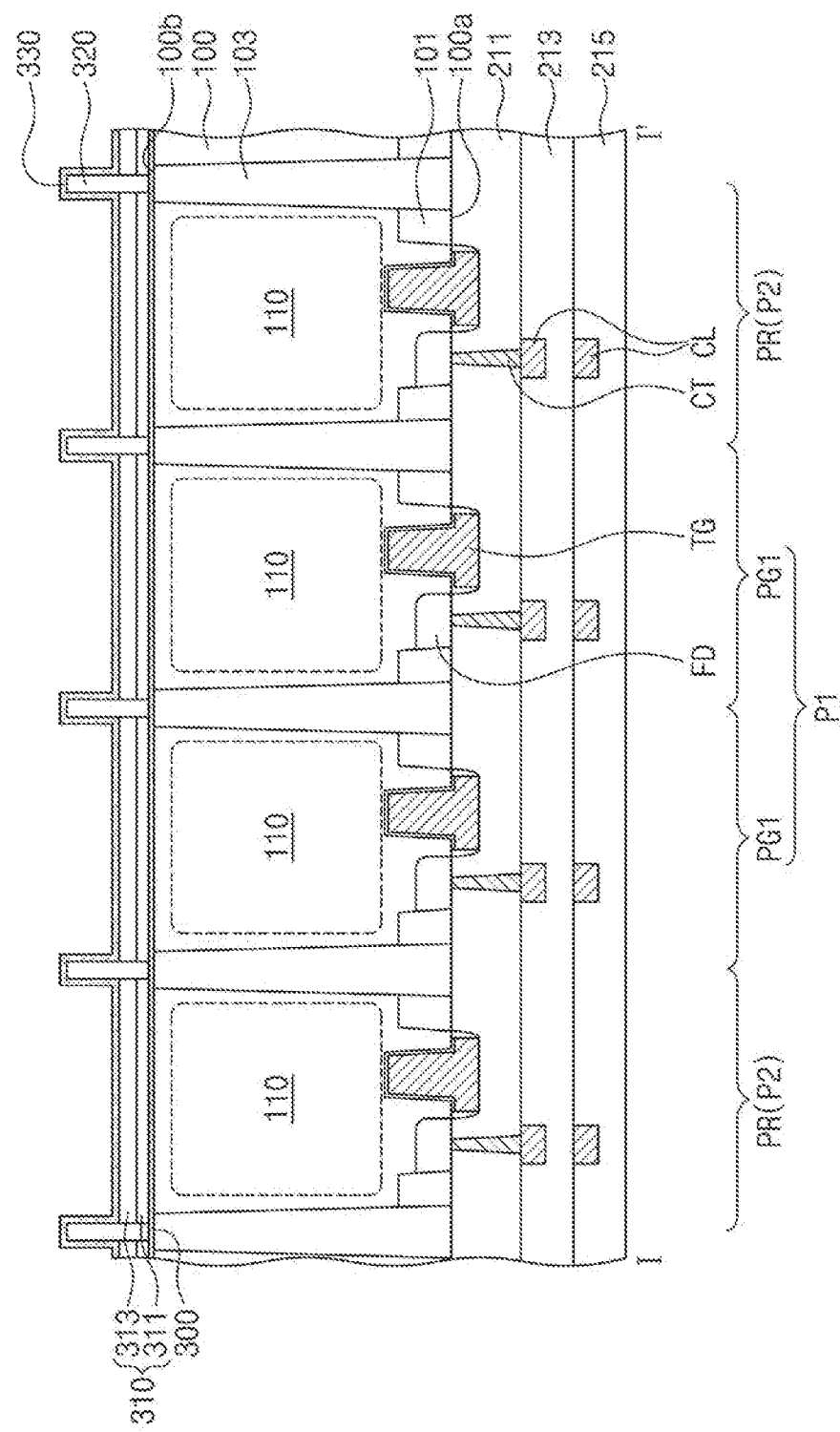

Referring to FIG. 17C, after the selective removal of the sacrificial patterns MP, a protective layer 330 may be conformally formed. For example, the protective layer 330 may have a uniform thickness that covers the top surface of the planar dielectric layer 310 and the sidewall and top surface of the grid structure 320. The removal of the sacrificial patterns MP and the formation of the protective layer 330 may form openings defined by a sidewall of the grid structure 320 and the top surface of the planar dielectric layer 310. As a result, as illustrated in FIG. 17C, a grid structure 320 may be formed which includes a low-refractive pattern.

Figure 17D:
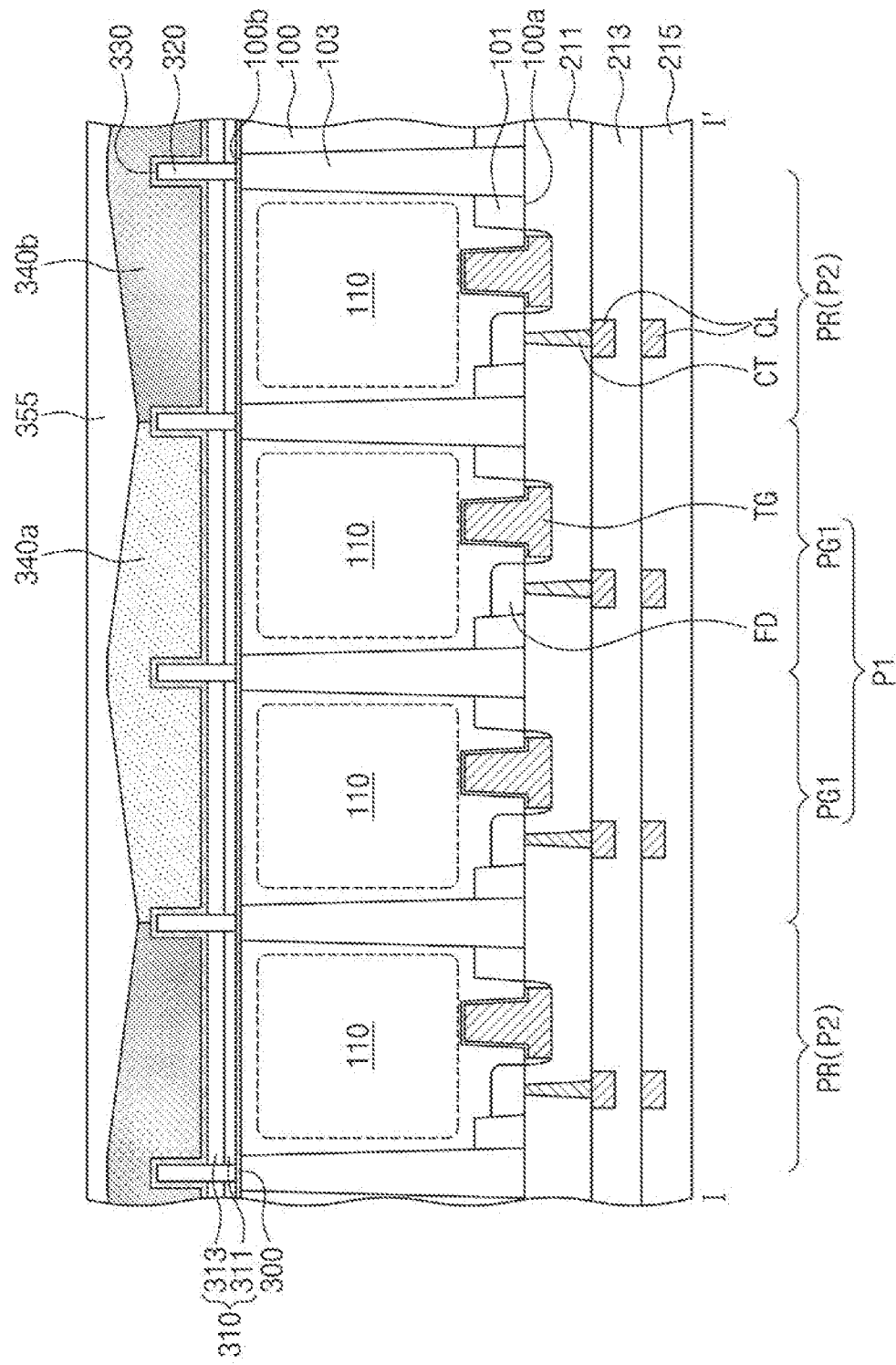

Referring to FIG. 17D, first preliminary color filters 340a, second preliminary color filters 340b, and third preliminary color filters may be formed to correspond to the first pixel regions P1, the second pixel regions P2, and the third pixel regions P3.

Because a coating process is performed to form each of the first preliminary color filter 340a, the second preliminary color filter 340b, and the third preliminary color filter as discussed with reference to FIG. 16F, each of the first preliminary color filter 340a, the second preliminary color filter 340b, and the third preliminary color filter may cover the first fence segment FS1 of the grid structure 320. As such, each of the first preliminary color filter 340a, the second preliminary color filter 340b, and the third preliminary color filter may have an upwardly convex top surface.

After that, as discussed with reference to FIG. 16G, a sacrificial planar layer 355 may be formed to cover the top surfaces of the first preliminary color filter 340a, the second preliminary color filter 340b, and the third preliminary color filter. The sacrificial planar layer 355 may cover uneven top surfaces of the preliminary color filters 340a and 340b, but may have a substantially flat top surface.

Afterwards, as discussed above, a planarization process may be performed on the sacrificial planar layer 355 and on the first preliminary color filter 340a, the second preliminary color filter 340b, and the third preliminary color filter. Therefore, first color filters 345a, second color filters 345b, and third color filters may be formed to correspond to the first pixel regions P1, the second pixel regions P2, and the third pixel regions P3. The color filters 345a and 345b may have substantially flat top surfaces.

According to some example embodiments, each pixel region of an image sensor may include a color filter, whose top surface is flat and whose thicknesses at its opposite sidewalls are substantially the same. Accordingly, the image sensor may improve its sensitivity degradation caused by thickness inequality of the color filter that fills an empty space defined by a grid structure.

Further, the color filters may be provided thereon with micro-lenses having a uniform radius of curvature. Therefore, cross-talk may be minimized between the pixel regions of the image sensor. As a result, the image sensor may increase in sensitivity and signal-to-noise ratio characteristics.

Although the inventive concept has been described in connection with some example embodiments illustrated in the accompanying drawings, it will be understood to those skilled in the art that various changes and modifications may be made without departing from the technical spirit of the present inventive concepts. It will be apparent to those skilled in the art that various substitution, modifications, and changes may be made thereto without departing from the scope and spirit of the appended claims.

What is claimed is:

1. An image sensor comprising:
a substrate;
a pixel separation structure defining a first pixel region and a second pixel region, each of the first pixel region and the second pixel region comprising N×N sub-pixel regions;
a grid structure disposed on the substrate and including first fence segments provided between the N×N sub-pixel regions, and second fence segments provided between the first pixel region and the second pixel region, the grid structure defining a plurality of openings corresponding respectively to the N×N sub-pixel regions; and
a plurality of color filters disposed in the openings defined by the grid structure, each of the color filters having a flat top surface across an entirety of the color filter, the flat top surface of each color filter being parallel to a bottom surface thereof,
wherein the plurality of color filters includes a plurality of first color filters corresponding to the N×N sub-pixel regions of the first pixel region and a plurality of second color filters corresponding to the N×N sub-pixel regions of the second pixel region.

2. The image sensor of claim 1, wherein the grid structure includes a protective layer that covers a top surface thereof, and the flat top surfaces of the color filters are coplanar with the top surface of the protective layer.

3. The image sensor of claim 1, wherein top surfaces of the color filters are lower than a top surface of the grid structure.

4. The image sensor of claim 1, wherein the grid structure includes a protective pattern that covers only sidewalls of the grid structure and bottom surfaces of the color filter, and top surfaces of the color filters are lower than a top surface of the grid structure.

5. The image sensor of claim 1, further comprising a fixed charge layer and a planar dielectric layer sequentially stacked between the substrate and the grid structure,
wherein the grid structure includes a light-shield pattern disposed on the planar dielectric layer, and a low-refractive pattern disposed on the light-shield pattern, and
wherein a thickness of the low-refractive pattern is greater than at least twice a thickness of the light-shield pattern, and
a thickness of each of the plurality of color filters is greater than the thickness of the low-refractive pattern.

6. The image sensor of claim 1, further comprising a micro-lens array disposed on the color filters, the micro-lens array including a planar segment disposed on the color filters and a plurality of micro-lenses on the planar segment that correspond to the N×N sub-pixel regions.

7. The image sensor of claim 1, wherein a height of the grid structure is less than the thickness of each of the plurality of color filters.

8. The image sensor of claim 1, wherein the substrate includes a pixel array region including the first pixel region and the second pixel region, and a pad region around the pixel array region,
the pixel array region includes a central region and an edge region that surrounds the central region,
the grid structure overlaps the pixel separation structure in the central region in plan view, and
the plurality of color filters have a thickness in the edge region that is smaller than a thickness in the central region.

9. An image sensor comprising:
a substrate;
a pixel separation structure defining a first pixel region and a second pixel region, each of the first pixel region and the second pixel region comprising N×N sub-pixel regions;
a grid structure disposed on the substrate and including first fence segments provided between the N×N sub-pixel regions, and second fence segments provided between the first pixel region and the second pixel region, the grid structure defining a plurality of openings corresponding respectively to the N×N sub-pixel regions; and
a plurality of color filters disposed in the openings defined by the grid structure, each of the color filters having a flat top surface,
wherein the plurality of color filters includes a plurality of first color filters corresponding to the N×N sub-pixel regions of the first pixel region and a plurality of second color filters corresponding to the N×N sub-pixel regions of the second pixel region, and
wherein the color filters have a first height adjacent to the first fence segments and a second height adjacent to the second fence segments, and a difference between the first height and the second height is from about 10 Å to about 100 Å.

10. The image sensor of claim 9, wherein the grid structure includes a protective layer that covers a top surface thereof, and the flat top surfaces of the color filters are coplanar with the top surface of the protective layer.

11. The image sensor of claim 9, wherein top surfaces of the color filters are lower than a top surface of the grid structure.

12. The image sensor of claim 9, wherein the grid structure includes a protective pattern that covers only sidewalls of the grid structure and bottom surfaces of the color filter, and
top surfaces of the color filters are lower than a top surface of the grid structure.

13. The image sensor of claim 9, further comprising a fixed charge layer and a planar dielectric layer sequentially stacked between the substrate and the grid structure,
wherein the grid structure includes a light-shield pattern disposed on the planar dielectric layer, and a low-refractive pattern disposed on the light-shield pattern, and
wherein a thickness of the low-refractive pattern is greater than at least twice a thickness of the light-shield pattern, and
a thickness of each of the plurality of color filters is greater than the thickness of the low-refractive pattern.

14. The image sensor of claim 9, further comprising a micro-lens array disposed on the color filters, the micro-lens array including a planar segment disposed on the color filters and a plurality of micro-lenses on the planar segment that correspond to the N×N sub-pixel regions.

15. The image sensor of claim 9, wherein a height of the grid structure is less than the thickness of each of the plurality of color filters.

16. The image sensor of claim 9, wherein the substrate includes a pixel array region including the first pixel region and the second pixel region, and a pad region around the pixel array region, the pixel array region includes a central region and an edge region that surrounds the central region, the grid structure overlaps the pixel separation structure in the central region in plan view, and the plurality of color filters have a thickness in the edge region that is smaller than a thickness in the central region.

17. An image sensor comprising:

a substrate including a pixel separation structure defining a plurality of pixel regions, and a plurality of sub-pixel regions for each pixel region of the plurality of pixel regions;

a grid structure disposed on the substrate and including first fence segments provided between the sub-pixel regions, and second fence segments provided between neighboring pixel regions, the grid structure defining a plurality of openings corresponding respectively to the plurality of sub-pixel regions;

a plurality of color filters disposed in the openings defined by the grid structure, each of the color filters having a flat top surface, the flat top surface of each color filter being parallel to a bottom surface thereof; and a fixed charge layer and a planar dielectric layer sequentially stacked between the substrate and the grid structure, wherein the grid structure includes a light-shield pattern disposed on the planar dielectric layer, and a low-refractive pattern disposed on the light-shield pattern, and wherein a height of the low-refractive pattern is from about 2,000 Å to about 5,000 Å, and a thickness of each of the color filters is about 5,000 Å to about 5,500 Å.

* * * * *